United States Patent
Moon et al.

(10) Patent No.: US 11,910,603 B2
(45) Date of Patent: Feb. 20, 2024

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Jesuk Moon, Hwaseong-si (KR); Juyoung Lim, Seoul (KR); Jongsoo Kim, Seoul (KR); Sunil Shim, Seoul (KR); Haemin Lee, Seoul (KR); Wonseok Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 301 days.

(21) Appl. No.: 17/225,493

(22) Filed: Apr. 8, 2021

(65) Prior Publication Data

US 2022/0085064 A1    Mar. 17, 2022

(30) Foreign Application Priority Data

Sep. 14, 2020    (KR) .................... 10-2020-0117865

(51) Int. Cl.
*H10B 43/27*    (2023.01)
*H01L 23/528*    (2006.01)
*H10B 41/10*    (2023.01)
*H10B 41/27*    (2023.01)
*H10B 41/35*    (2023.01)
*H10B 41/40*    (2023.01)
*H10B 43/10*    (2023.01)
(Continued)

(52) U.S. Cl.
CPC ......... *H10B 43/27* (2023.02); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/27; H10B 41/10; H10B 43/35; H10B 41/35; H10B 41/40; H10B 43/40; H10B 43/10; H10B 41/27; H01L 23/5283
See application file for complete search history.

(56) References Cited

U.S. PATENT DOCUMENTS 9,000,508 B2    4/2015  Lee et al.
9,406,692 B2    8/2016  Lee
(Continued)

FOREIGN PATENT DOCUMENTS

KR    10-2015-0081393 A    7/2015

*Primary Examiner* — Shih Tsun A Chou
(74) *Attorney, Agent, or Firm* — Muir Patent Law, PLLC

(57) ABSTRACT

A vertical memory device includes a gate electrode structure on a substrate, a channel extending through the gate electrode structure, and an etch stop layer on a sidewall of the gate electrode structure. The gate electrode structure includes gate electrodes spaced apart from each other in a first direction and stacked in a staircase shape. The channel includes a first portion and a second portion contacting the first portion. A lower surface of the second portion has a width less than a width of an upper surface of the first portion. The etch stop layer contacts at least one gate electrode of the gate electrodes, and overlaps an upper portion of the first portion of the channel in a horizontal direction. The at least one gate electrode contacting the etch stop layer is a dummy gate electrode including an insulating material.

20 Claims, 28 Drawing Sheets

(51) Int. Cl.
*H10B 43/35* (2023.01)
*H10B 43/40* (2023.01)

(56) References Cited

U.S. PATENT DOCUMENTS

| | | |
|---|---|---|
| 9,576,967 B1 * | 2/2017 | Kimura .................. H10B 43/10 |
| 9,691,783 B2 | 6/2017 | Yoon |
| 9,698,153 B2 | 7/2017 | Liu et al. |
| 9,871,052 B2 | 1/2018 | Lee |
| 10,217,758 B2 | 2/2019 | Oh |
| 10,418,374 B2 | 9/2019 | Lee et al. |
| 10,553,609 B2 | 2/2020 | Lee et al. |
| 2015/0279855 A1 | 10/2015 | Lu et al. |
| 2019/0237476 A1 * | 8/2019 | Lee ........................ H10B 43/10 |
| 2021/0082525 A1 * | 3/2021 | Suematsu ............... G11C 5/063 |

\* cited by examiner

SEMICONDUCTOR DEVICE AND ELECTRONIC SYSTEM INCLUDING THE SAME

CROSS-REFERENCE TO RELATED APPLICATION

Korean Patent Application No. 10-2020-0117865, filed on Sep. 14, 2020, in the Korean Intellectual Property Office, and entitled: "Semiconductor Device and Electronic System Including the Same," is incorporated by reference herein in its entirety.

BACKGROUND

1. Field

Embodiments relate to a semiconductor device and an electronic system including the same.

2. Description of the Related Art

In an electronic system having data storage, a high capacity semiconductor device that may store high capacity data. Thus, a method of increasing the data storage capacity of the semiconductor device has been considered. For example, a semiconductor device including memory cells that may be 3-dimensionally stacked has been considered.

SUMMARY

Embodiments are directed to a semiconductor device including a gate electrode structure on a substrate, a channel extending through the gate electrode structure, and an etch stop layer on a sidewall of the gate electrode structure. The gate electrode structure may include gate electrodes spaced apart from each other in a first direction perpendicular to an upper surface of the substrate and stacked in a staircase shape. The channel may include a first portion extending in the first direction on the substrate and a second portion extending in the first direction on and contacting the first portion. A lower surface of the second portion may have a width less than a width of an upper surface of the first portion. The etch stop layer may contact at least one gate electrode of the gate electrodes, and overlap an upper portion of the first portion of the channel in a horizontal direction substantially parallel to the upper surface of the substrate. The at least one gate electrode contacting the etch stop layer may be a dummy gate electrode including an insulating material.

Embodiments are also directed to a semiconductor device, including a gate electrode structure on a substrate, a memory channel structure extending through the gate electrode structure, an etch stop layer on a sidewall of the gate electrode structure, contact plugs, and first upper wirings. The gate electrode structure may include gate electrodes spaced apart from each other in a first direction perpendicular to an upper surface of the substrate and stacked in a staircase shape. The memory channel structure may include a channel, a charge storage structure, a filling pattern, and a pad. The channel may have a first portion extending in the first direction on the substrate and a second portion extending in the first direction on and contacting the first portion. A lower surface of the second portion may have a width less than a width of an upper surface of the first portion. The charge storage structure may be formed on an outer sidewall of the channel. The filling pattern may contact an inner sidewall of the channel and having a pillar shape. The pad may be formed on upper surfaces of the channel and the filling pattern, and may contact an inner sidewall of the charge storage structure. The etch stop layer may be formed on a sidewall of the gate electrode structure and contact a dummy gate electrode of the gate electrodes including an insulating material. The etch stop layer may overlap an upper portion of the first portion of the channel in a horizontal direction substantially parallel to the upper surface of the substrate. The contact plugs may be electrically connected to respective ones of the gate electrodes except for the dummy gate electrode. The first upper wirings may be electrically connected to the contact plugs and applying electrical signals thereto.

Embodiments are also directed to an electronic system, including a controller; and a semiconductor device electrically connected to the controller through an input/output pad. The semiconductor device may include peripheral circuit wirings electrically connected to the input/output pad; and a memory cell structure electrically connected to the peripheral circuit wirings. The memory cell structure may include a gate electrode structure on a substrate, the gate electrode structure including gate electrodes spaced apart from each other in a first direction perpendicular to an upper surface of the substrate and stacked in a staircase shape; and a channel extending through the gate electrode structure. The channel may include a first portion extending in the first direction on the substrate; and a second portion extending in the first direction on and contacting the first portion, a lower surface of the second portion having a width less than a width of an upper surface of the first portion. The memory cell structure may further include a charge storage structure on an outer sidewall of the channel; and an etch stop layer on a sidewall of the gate electrode structure and contacting a dummy gate electrode of the gate electrodes, the dummy gate electrode including an insulating material, and the etch stop layer overlapping an upper portion of the first portion of the channel in a horizontal direction substantially parallel to the upper surface of the substrate.

BRIEF DESCRIPTION OF THE DRAWINGS

Features will become apparent to those of skill in the art by describing in detail example embodiments with reference to the attached drawings in which.

DETAILED DESCRIPTION

Figure 1:
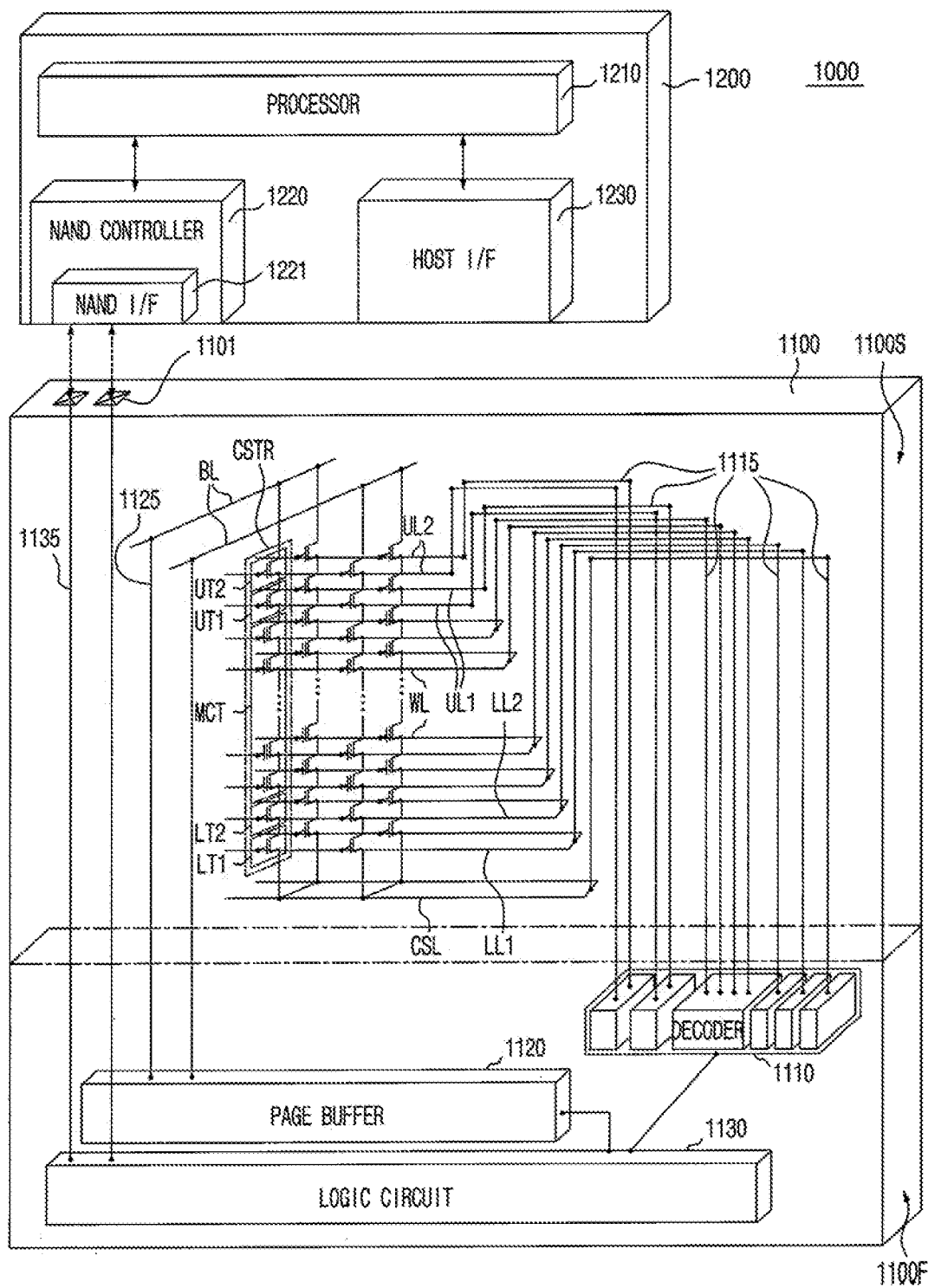
FIG. 1 is a schematic diagram illustrating an electronic system including a semiconductor device in accordance with an example embodiment.

FIG. 1 is a schematic diagram illustrating an electronic system including a semiconductor device in accordance with an example embodiment.

Referring to FIG. 1, an electronic system 1000 may include a semiconductor device 1100 and a controller 1200 electrically connected to the semiconductor device 1100. The electronic system 1000 may be a storage device including one or a plurality of semiconductor devices 1100, or may be an electronic device including a storage device including one or a plurality of semiconductor devices 1100. For example, the electronic system 1000 may be a solid state drive (SSD) device, a universal serial bus (USB), a computing system, a medical device, or a communication device that may include one or a plurality of semiconductor devices 1100.

The semiconductor device 1100 may be a non-volatile memory device. As an example, a NAND flash memory device that will be illustrated with reference to FIGS. 21 to 28.

The semiconductor device 1100 may include a first structure 1100F and a second structure 1100S on the first structure 1100F. In the drawing, the first structure 1100F is disposed under the second structure 1100S, but it may be disposed beside or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In an example embodiment, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In an example embodiment, the lower transistors LT1 and LT2 may include a lower erase control transistor LT1 and a ground selection transistor LT2 that may be connected with each other in series. The upper transistors UT1 and UT2 may include a string selection transistor UT1 and an upper erase control transistor UT2. At lease one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1100S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor MCT among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control commands for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When a control command is received from the outside host through the host interface 1230, the processor 1210 may control the semiconductor device 1100 in response to the control command.

Figure 2:
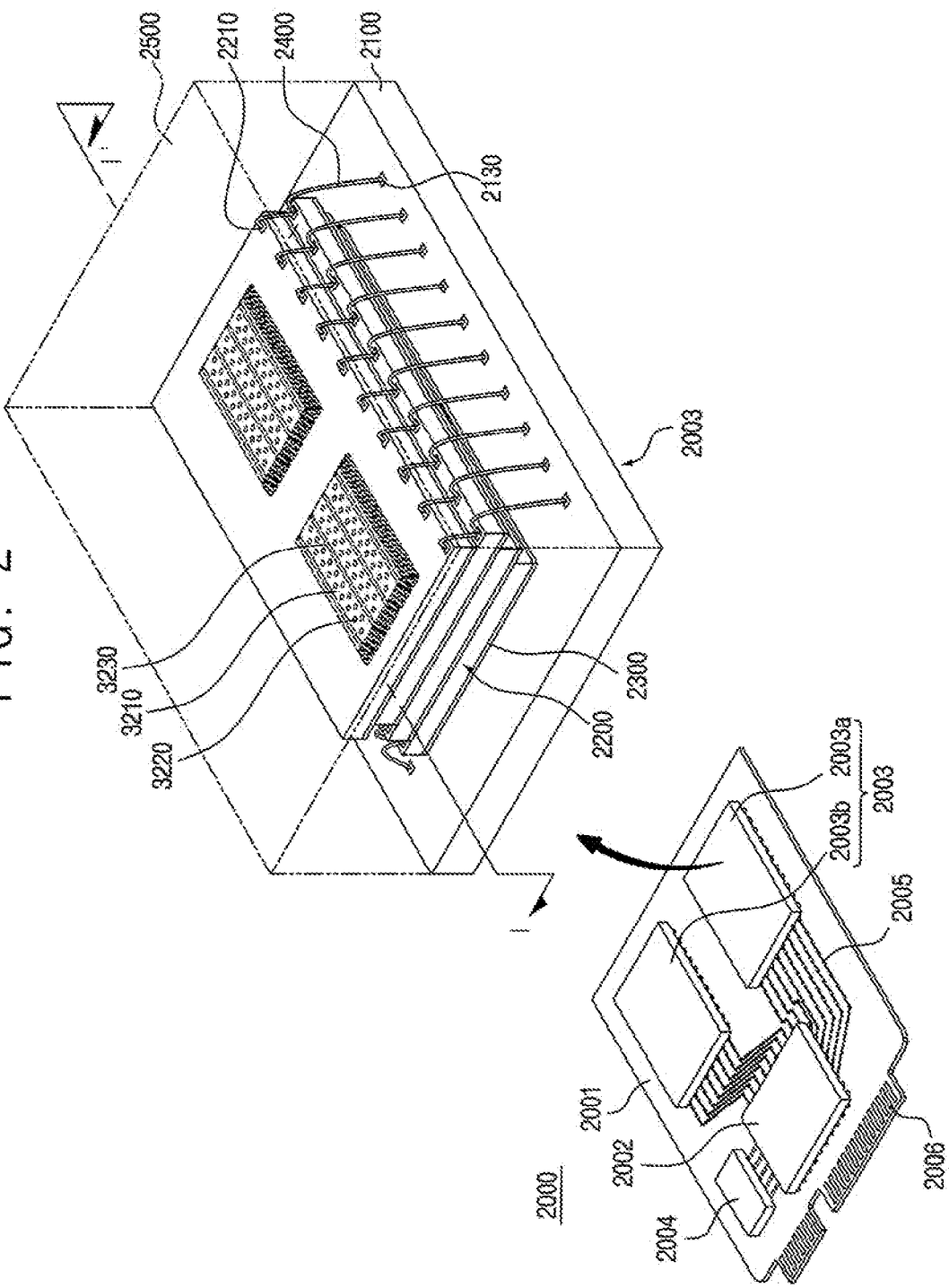
FIG. 2 is a schematic perspective view illustrating an electronic system including a semiconductor device in accordance with an example embodiment.

FIG. 2 is a schematic perspective view illustrating an electronic system including a semiconductor device in accordance with an example embodiment.

Referring to FIG. 2, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected with each other by wiring patterns 2005 on the main substrate 2001.

The main substrate 2001 may include a connector 2006 having a plurality of pins connected to an outside host. The number and layout of the plurality pins in the connector 2006 may be changed depending on communication interface between the electronic system 2000 and the outside host. In example embodiments, the electronic system 2000 may communicate with the outside host according to one of a USB, peripheral component interconnect express (PCI-Express), serial advanced technology attachment (SATA), M-Phy for universal flash storage (UFS), etc. In example embodiments, the electronic system 2000 may be operated by power source provided from the outside host through the connector 2006. The electronic system 2000 may further include power management integrated circuit (PMIC) for distributing the power source provided from the outside host to the controller 2002 and the semiconductor package 2003.

The controller 2002 may write data in the semiconductor package 2003 or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages, each of which may include a plurality of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100.

The package substrate 2100 may be a printed circuit board (PCB) that covers package upper pads 2130. Each semiconductor chip 2200 may include an input/output pad 2210. The input/output pad 2210 may correspond to the input/output pad 1101 of FIG. 1. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 21 to 23.

In an example embodiment, the connection structure 2400 may be a bonding wire electrically connecting the input/output pad 2210 and the package upper pads 2130. Thus, in the first and second semiconductor packages 2003a and 2003b, the semiconductor chips 2200 may be electrically connected with each other by a bonding wire method, and may be electrically connected to the package upper pads 2130 of the package substrate 2100. In another implementation, in each of the first and second semiconductor packages 2003a and 2003b, the semiconductor chips 2200 may be electrically connected with each other by a connection structure including a through silicon via (TSV), instead of the connection structure 2400 of the bonding wire method.

In an example embodiment, the controller 2002 and the semiconductor chips 2200 may be included in one package. In an example embodiment, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 3:
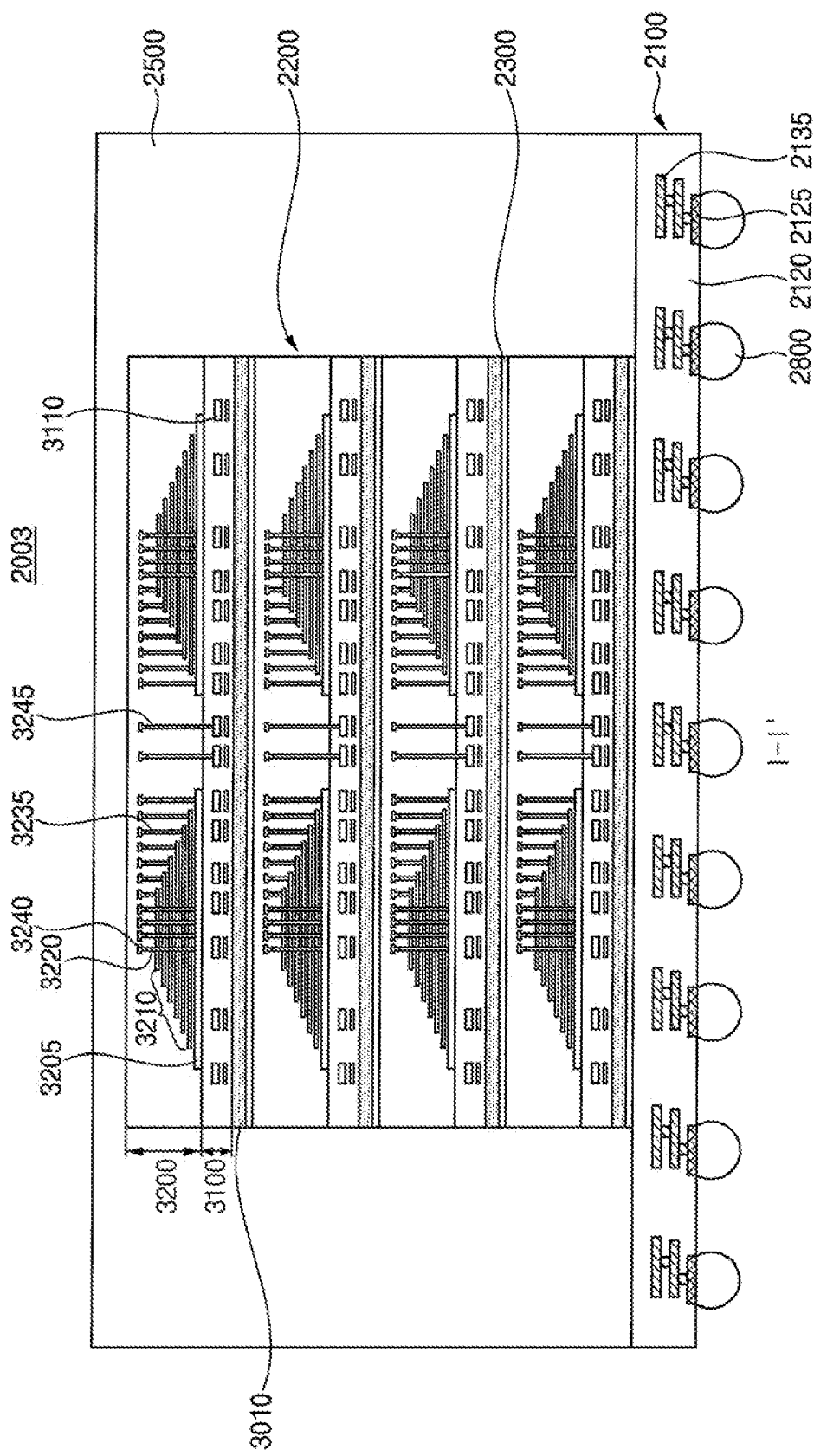
FIGS. 3 and 4 are schematic cross-sectional views illustrating semiconductor packages each of which may include a semiconductor device in accordance with example embodiments.
Figure 4:
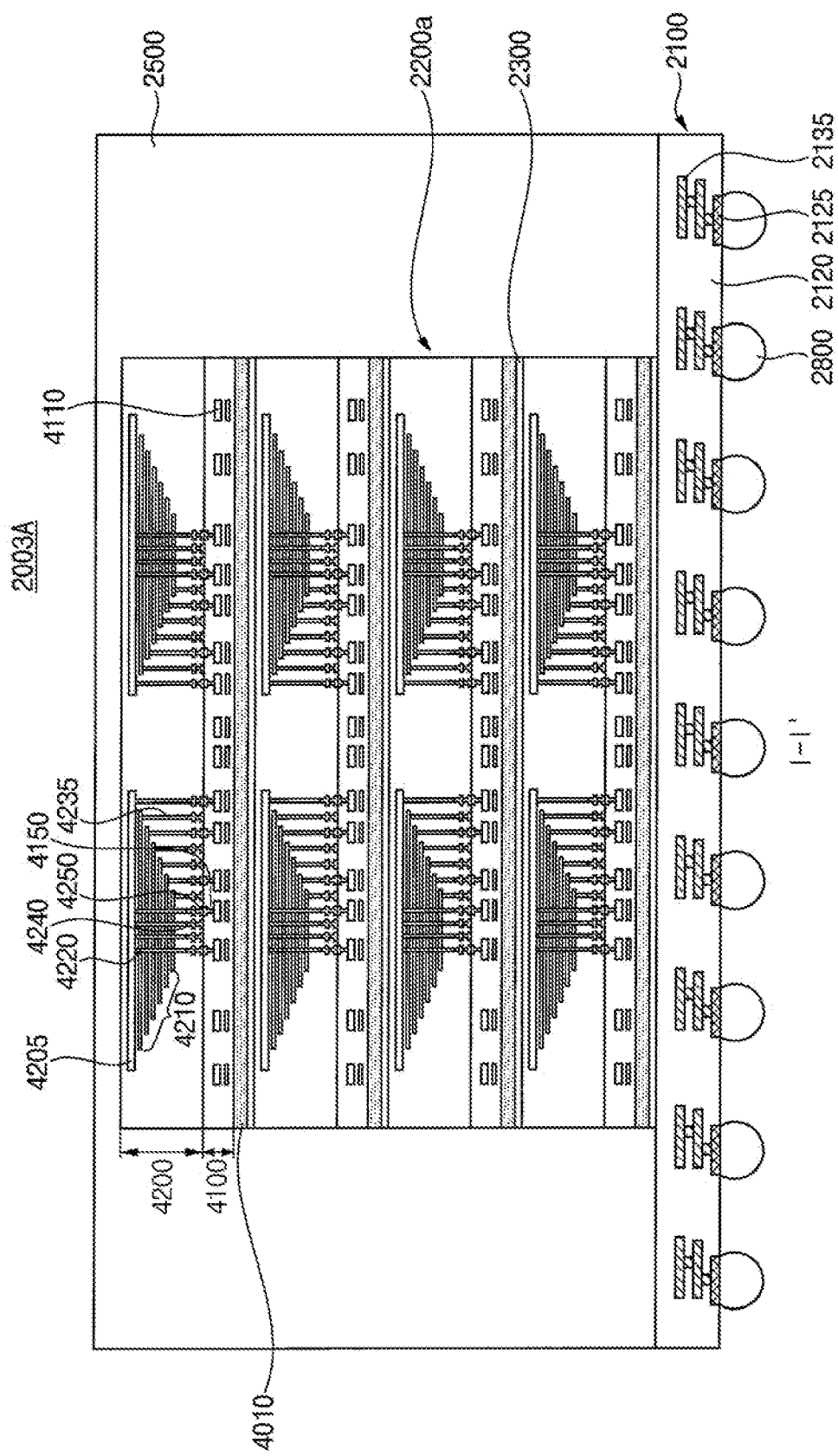

FIGS. 3 and 4 are schematic cross-sectional views illustrating semiconductor packages, each of which may include a semiconductor device in accordance with example embodiments. FIGS. 3 and 4 illustrate example embodiments of the semiconductor package 2003 shown in FIG. 2, and show a cross-section taken along a line I-I' of the semiconductor package 2003 in FIG. 2.

Referring to FIG. 3, in the semiconductor package 2003, the package substrate 2100 may be a PCB. The package substrate 2100 may include a substrate body part 2120, package upper pads 2130 (refer to FIG. 2) at an upper surface of the substrate body part 2120, lower pads 2125 at a lower surface of the substrate body part 2120 or exposed through the lower surface of the substrate body part 2120, and inner wirings 2135 for electrically connecting the package upper pads 2130 and the lower pads 2125 in an inside of the substrate body part 2120. The package upper pads 2130 may be electrically connected to the connection structures 2400. The lower pads 2125 may be connected to wiring patterns 2005 of the main substrate 2010 in the electronic system 2000 through conductive connection parts 2800, as in FIG. 2.

Figure 21:
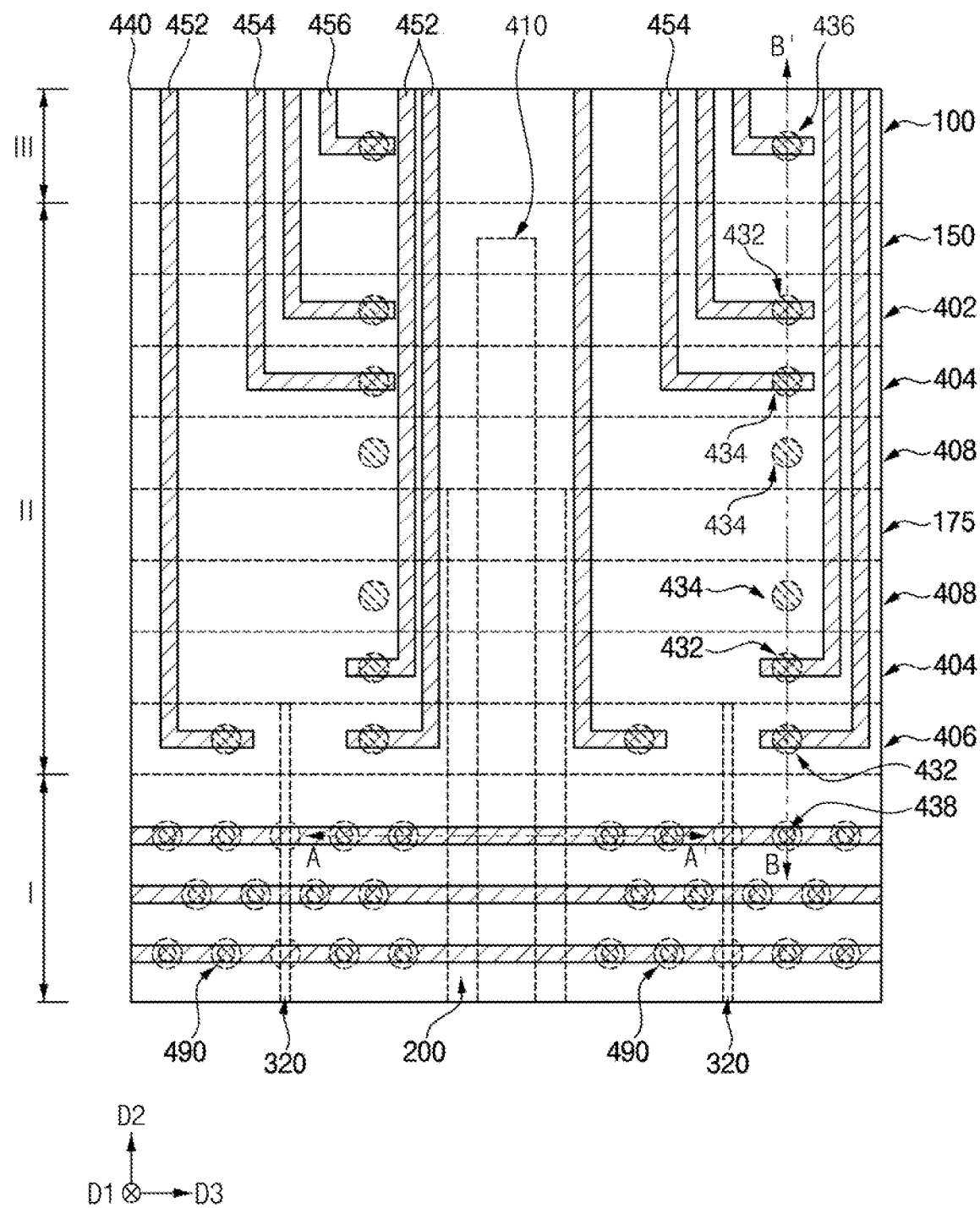
Figure 22:
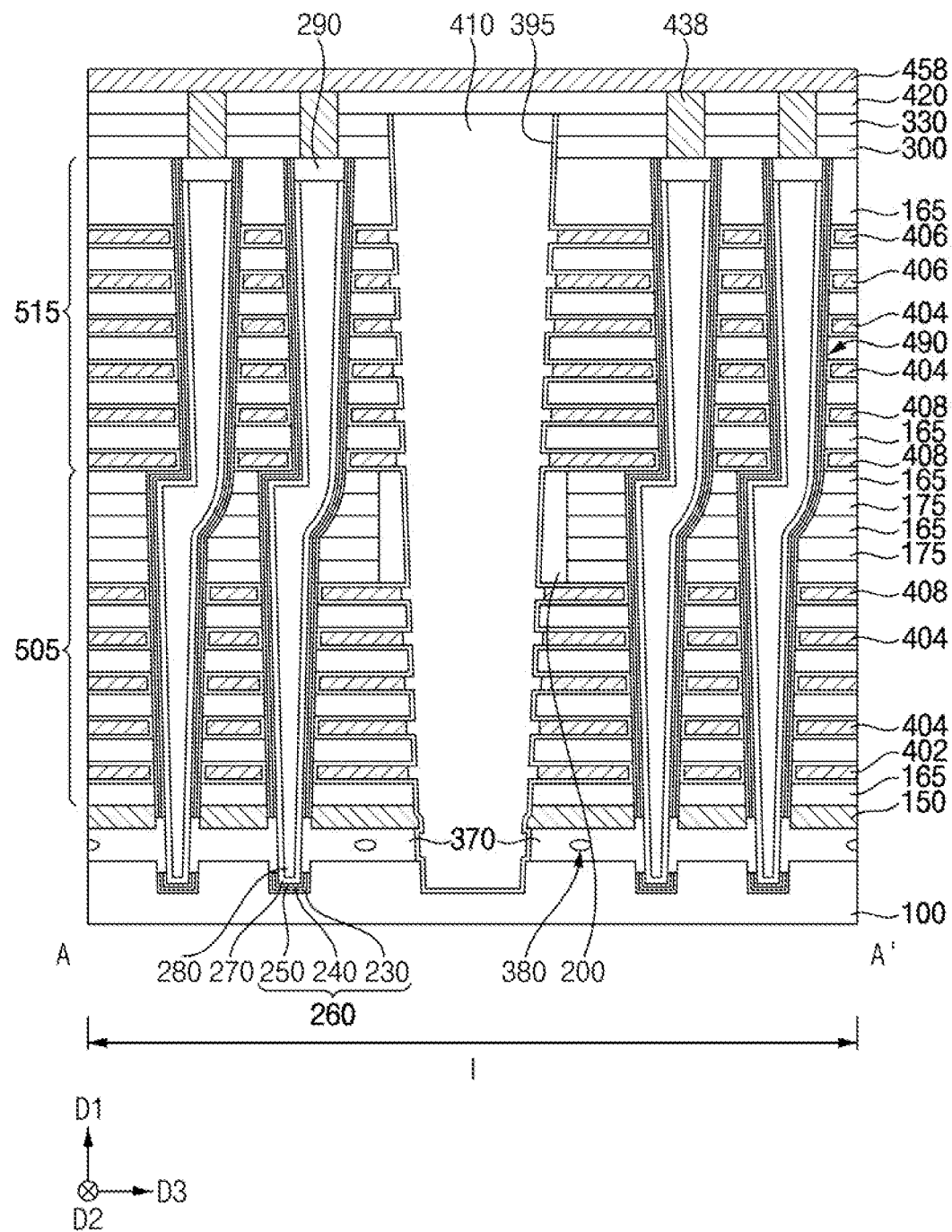
Figure 23:
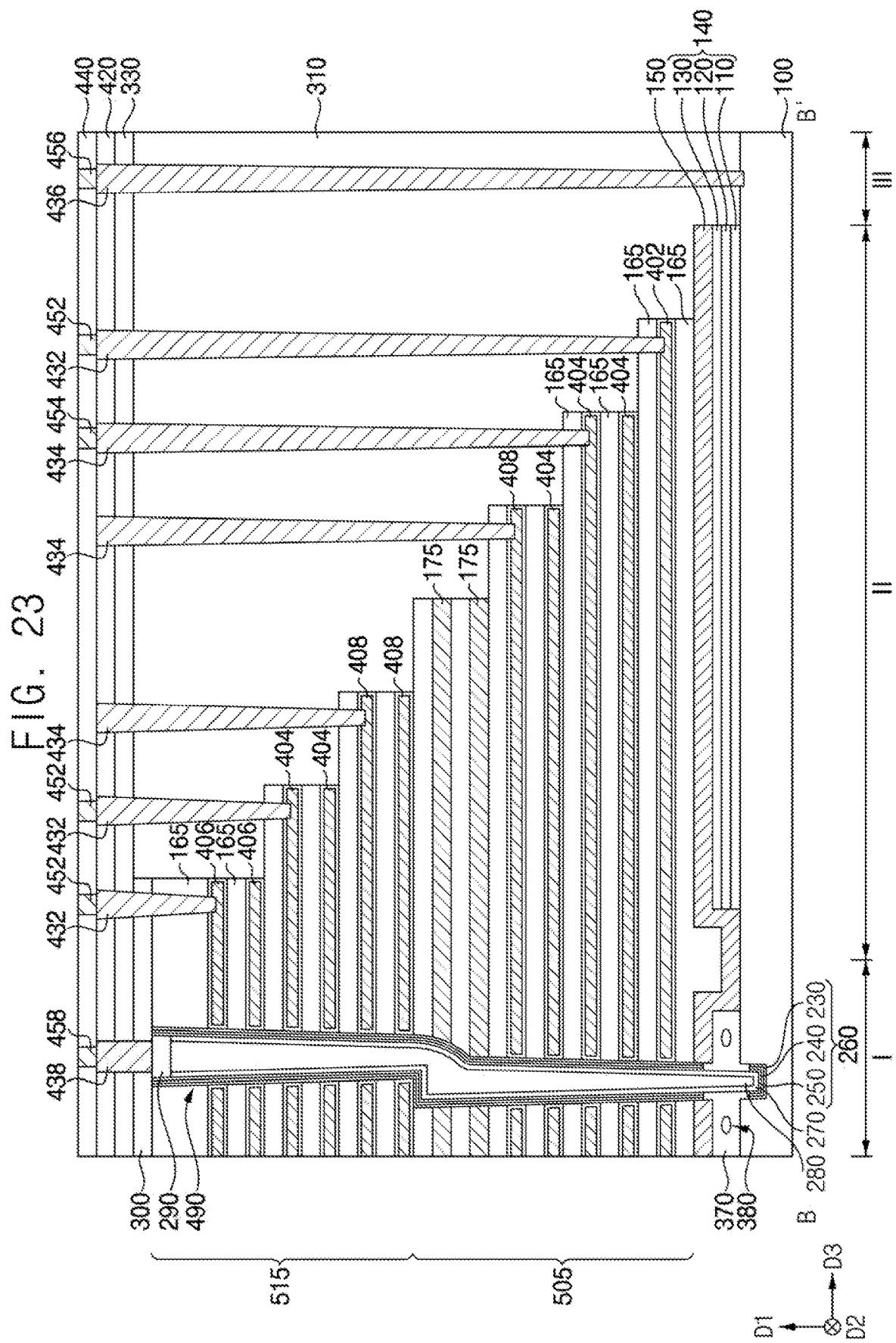

Each semiconductor chip 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 2) extending through the gate electrode structure 3210, bit lines 3240 electrically connected to the memory channel structures 3220, and gate connection wirings 3235 electrically connected to the word lines WL of the gate electrode structure 3210 (refer to FIG. 1). The second structure 3200 may further include an etch stop layer 200 as illustrated in FIGS. 21 to 23.

Each semiconductor chip 2200 may include a through wiring 3245 that is electrically connected to the peripheral circuit wirings 3110 of the first structure 3100 and extends in the second structure 3200. The through wiring 3245 may be disposed at an outside of the gate electrode structure 3210, and some through wirings 3245 may extend through the gate electrode structure 3210. Each semiconductor chip 2200 may further include the input/output pad 2210 (refer to FIG. 2) electrically connected to the peripheral circuit wirings 3110 of the first structure 3100.

Referring to FIG. 4, in a semiconductor package 2003A, each semiconductor chip 2200a may include a semiconductor substrate 4010, a first structure 4100 on the semiconductor substrate 4010, and a second structure 4200 on and bonded with the first structure 4100 by a wafer bonding method.

The first structure 4100 may include a peripheral circuit region in which a peripheral circuit wiring 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 2) extending through the gate electrode structure 4210, and second bonding structures 4250 electrically connected to the memory channel structures 4220 and the word lines WL (refer to FIG. 1) of the gate electrode structure 4210. For example, the second bonding structures 4250 may be electrically connected to the memory channel structures 4220 and the word lines WL (refer to FIG. 1) through the bit lines 4240 electrically connected to the memory channel structures 4220 and the gate connection wirings 4235 electrically connected to the word lines WL (refer to FIG. 1), respectively. The first bonding structures 4150 of the first structure 4100 and the second bonding structures 4250 of the second structure 4200 may contact each other and may be bonded with each other. The first bonding structures 4150 and the second bonding structures 4250 may include, e.g., copper. The second structure 4200 may further include the etch stop layer 200 shown in FIGS. 21 to 23.

Each semiconductor chip 2200a may further include the input/output pad 2210 (refer to FIG. 2) electrically connected to the peripheral circuit wirings 4110 of the first structure 4100.

The semiconductor chips 2200 of FIG. 3 and the semiconductor chips 2200a of FIG. 4 may be electrically connected with each other by the connection structures 2400 in a bonding wire method. However, in an example embodiment, semiconductor chips such as the semiconductor chips 2200 of FIG. 3 and the semiconductor chips 2200a of FIG. 4 in the same semiconductor package may be electrically connected with each other by a connection structure including a TSV.

FIGS. 5 to 23 are plan views and cross-sectional views illustrating a method of manufacturing a vertical memory device in accordance with example embodiments. Particularly, FIGS. 5, 7, 10, 12, 14, 16, and 21 are the plan views, FIGS. 6, 8, 9, 11, 17-20, and 22 are cross-sectional views taken along lines A-A', respectively, of corresponding plan views, and FIGS. 13, 15, and 23 are cross-sectional views taken along lines B-B', respectively, of corresponding plan views.

This semiconductor device may correspond to the second structure 1100S of FIG. 1, the semiconductor chips 2200 of FIG. 2, and the second structure 3200 of FIG. 3.

A direction substantially perpendicular to an upper surface of a first substrate may be defined as a first direction D1, and two directions substantially parallel to the upper surface of the first substrate and crossing each other may be defined as second and third directions D2 and D3, respectively. In an example embodiment, the second and third directions D2 and D3 may be substantially perpendicular to each other.

Figure 5:
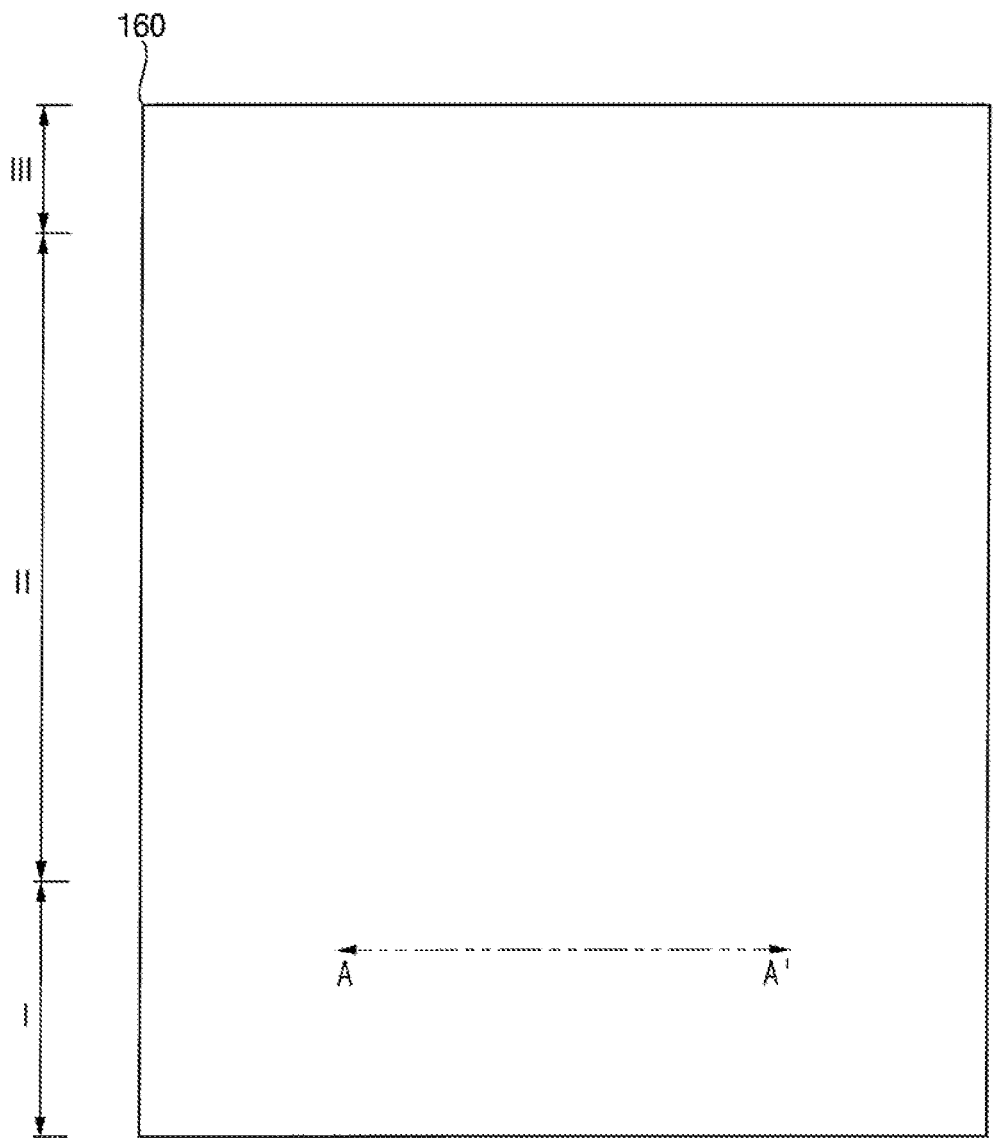
FIGS. 5 to 23 are plan views and cross-sectional views illustrating a method of manufacturing a vertical memory device in accordance with example embodiments.
Figure 6:
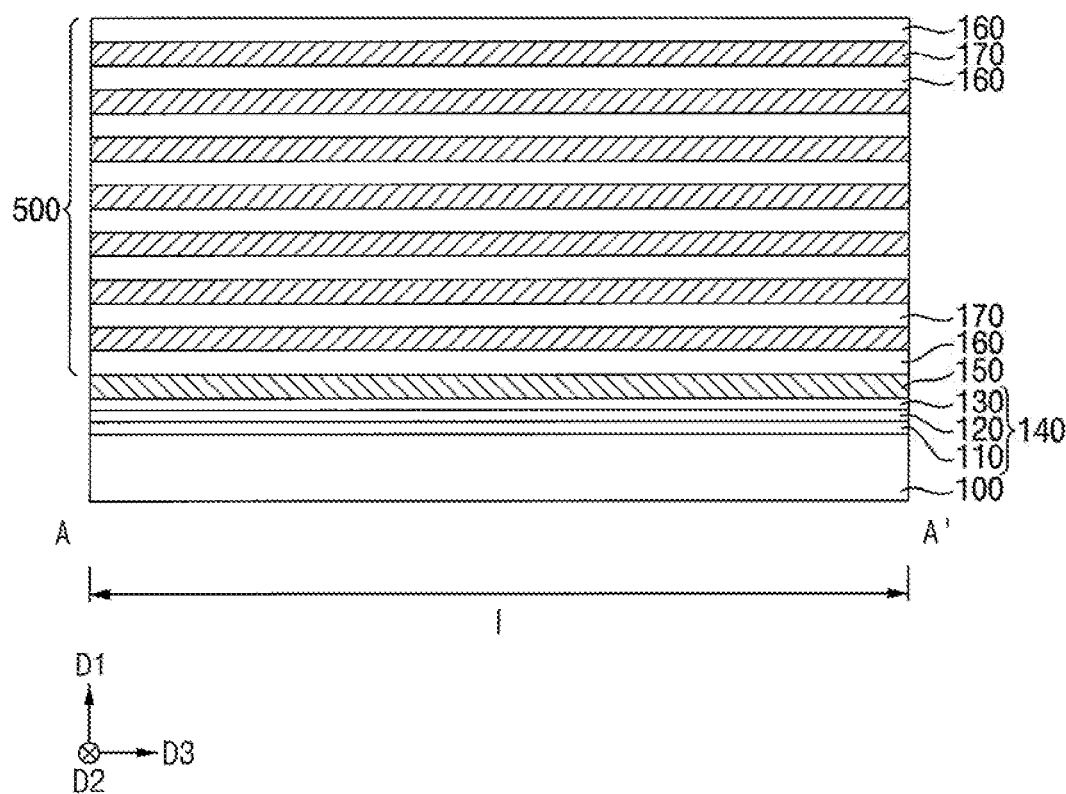

Referring to FIGS. 5 and 6, a sacrificial layer structure 140 and a support layer 150 may be formed on a first substrate 100, and a first insulation layer 160 and a fourth sacrificial layer 170 may be alternately and repeatedly stacked on the support layer 150 to form a first mold layer 500.

The first substrate 100 may include, e.g., silicon, germanium, silicon-germanium, or a III-V compound such as GaP, GaAs, GaSb, etc. In an example embodiment, the first substrate 100 may be a silicon-on-insulator (SOI) substrate or a germanium-on-insulator (GOI) substrate.

The first substrate 100 may include first, second, and third regions I, II, and III. The first region I may be a cell array region in which memory cells may be formed. The second region II may at least partially surround the first region I, and may be a pad region or extension region in which contact plugs for transferring electrical signals to the memory cells may be formed. The third region III may at least partially surround the second region II, and may be a peripheral circuit region in which peripheral circuits for applying electrical signals to the memory cells may be formed.

The sacrificial layer structure 140 may include first, second, and third sacrificial layers 110, 120, and 130 sequentially stacked in the first direction D1. The first and third sacrificial layers 110 and 130 may include an oxide, e.g., silicon oxide, and the second sacrificial layer 120 may include a nitride, e.g., silicon nitride. A first recess (not shown) may be formed to extend through the sacrificial layer structure 140 and expose an upper surface of the first substrate 100.

The support layer 150 may include a material having an etching selectivity with respect to the first to third sacrificial layers 110, 120, and 130, e.g., polysilicon doped with n-type impurities. In an example embodiment, the support layer 150 may be formed by depositing amorphous silicon doped with n-type impurities, and crystallizing the amorphous silicon by a heat treatment process or by subsequent deposition processes of other layers so that the support layer 150 may include polysilicon doped with n-type impurities.

The support layer 150 may have a constant thickness on the sacrificial layer structure 140 and the exposed upper surface of the first substrate 100 exposed by the first recess, and a portion of the support layer 150 in the first recess may be referred to as a support pattern.

The first insulation layer 160 may include an oxide, e.g., silicon oxide, and the fourth sacrificial layer 170 may include a material having an etching selectivity with respect to the first insulation layer 160, e.g., a nitride such as silicon nitride.

FIG. 6 shows the first mold layer 500 include the first insulation layers 160 and the fourth sacrificial layers 170 stacked at 8 levels and 7 levels, respectively, but the first insulation layers 160 and the fourth sacrificial layers 170 may be stacked at more than 8 levels and 7 levels, respectively.

Figure 7:
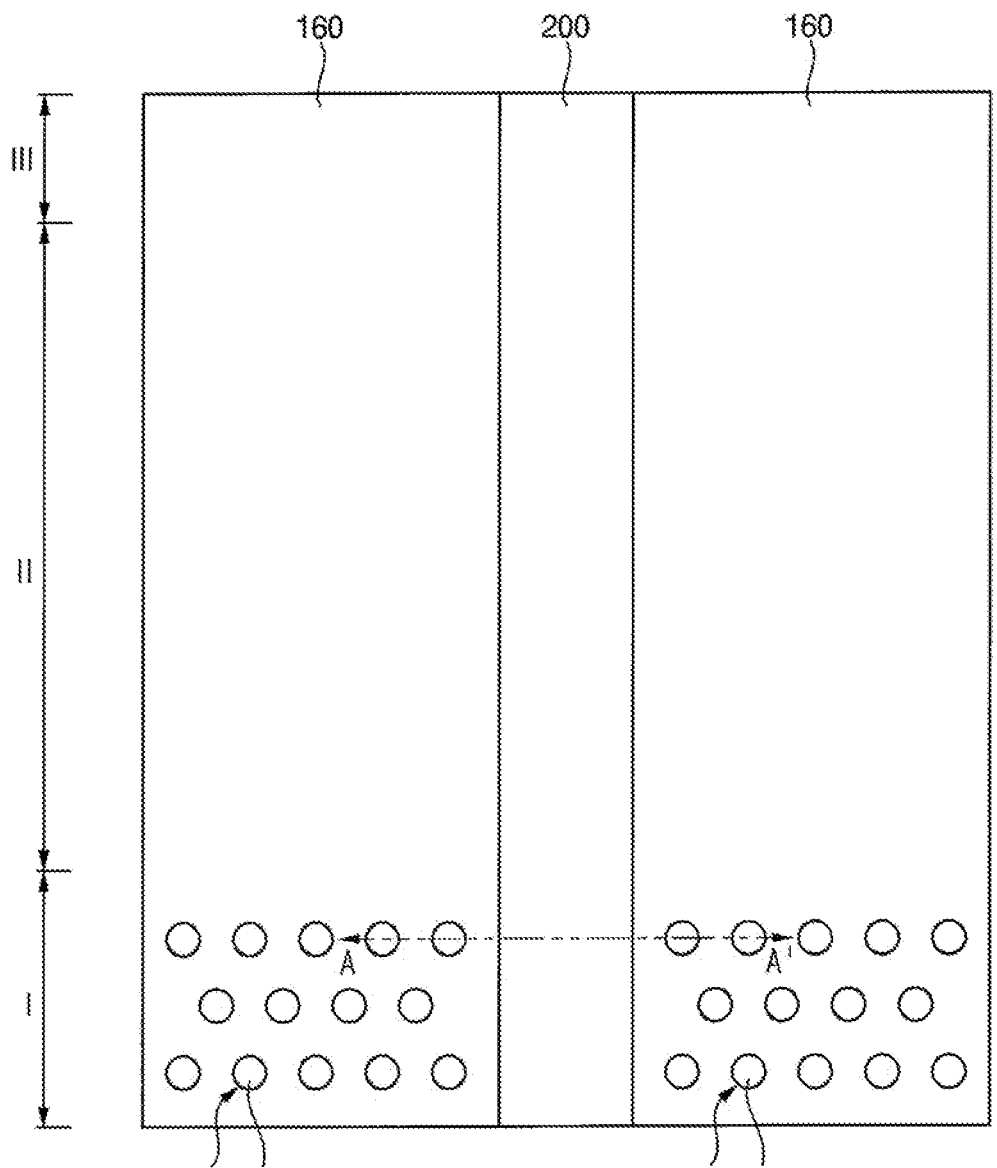
Figure 8:
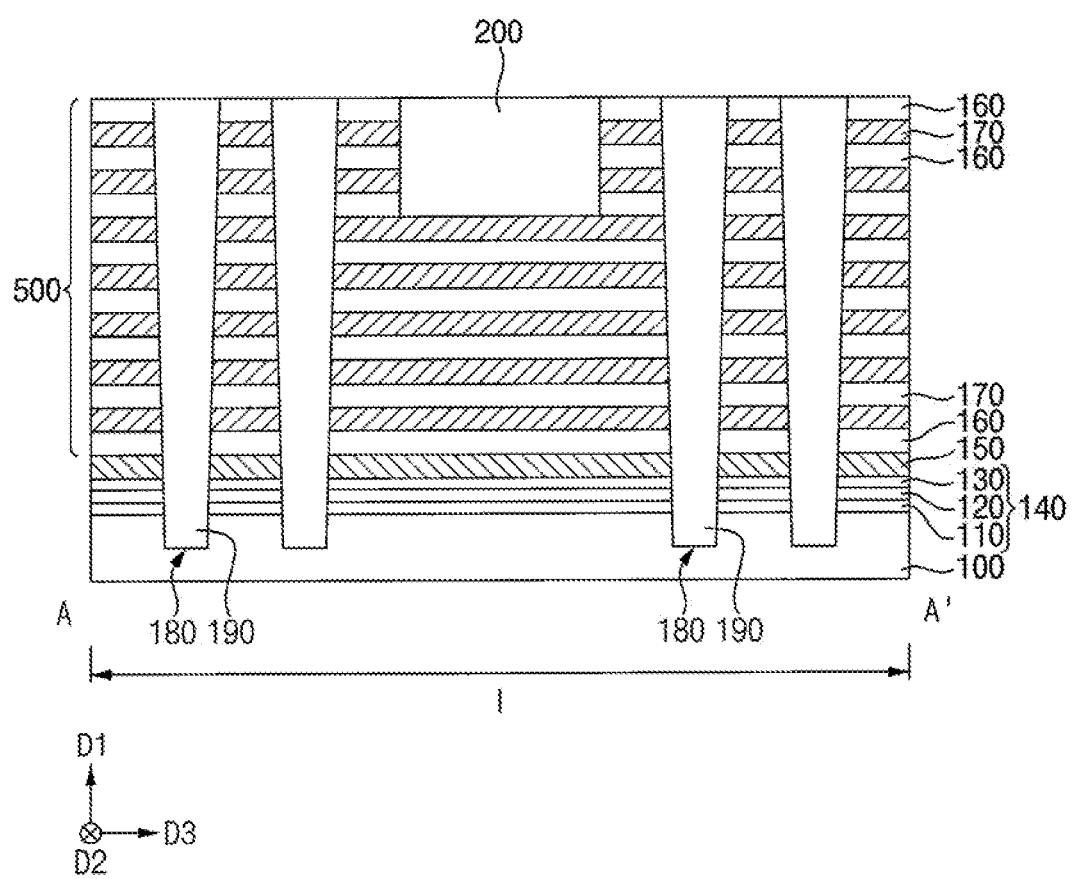

Referring to FIGS. 7 and 8, a first channel hole 180 may be formed through the first mold layer 500, the support layer 150, and the sacrificial layer structure 140 to expose an upper surface of the first substrate 100. A fifth sacrificial pattern 190 may be formed to fill the first channel hole 180.

A photoresist pattern (not shown) may be formed on an uppermost one of the first insulation layers 160 included in the first mold layer 500. The first insulation layers 160 and the fourth sacrificial layers 170 of the first mold layer 500, the support layer 150, and the sacrificial layer structure 140 may be etched using the photoresist pattern as an etching mask to form the first channel hole 180 exposing the upper surface of the first substrate 100. In an example embodiment, a plurality of first channel holes 180 may be formed in each of the second and third directions D2 and D3, and thus a first channel hole array may be defined.

In an example embodiment, due to the characteristics of the etching process, each of the first channel holes 180 may have a width gradually decreasing from a top toward a bottom thereof.

A fifth sacrificial layer may be formed on the first substrate 100 and the uppermost one of the first insulation layers 160 to fill the first channel holes 180, and may be planarized until an upper surface of the uppermost one of the first insulation layers 160 is exposed to form the fifth sacrificial pattern 190 in each of the first channel hole 180. The fifth sacrificial pattern 190 may include a material having an etching selectivity with respective to the first insulation layer 160 and the fourth sacrificial layer 170, e.g., polysilicon.

A first opening may be formed through the first insulation layers 160 and the fourth sacrificial layers 170 of the first mold layer 500 at upper levels between the first channel hole arrays. An etch stop layer 200 may be formed in the first opening. In an example embodiment, the etch stop layer 200 may extend in the second direction D2. In the drawing, the etch stop layer 200 extends through the first insulation layers 160 and the fourth sacrificial layers 170 at upper three levels and at upper two levels, respectively, but the number of the first insulation layers 160 and the fourth sacrificial layers 170 through which the etch stop layer 200 extends may be varied.

In an example embodiment, the etch stop layer 200 may include a material having an etching selectivity with respect to the fourth sacrificial layer 170, e.g., an oxide such as silicon oxide, and thus may be merged with the first insulation layer 160.

Figure 9:
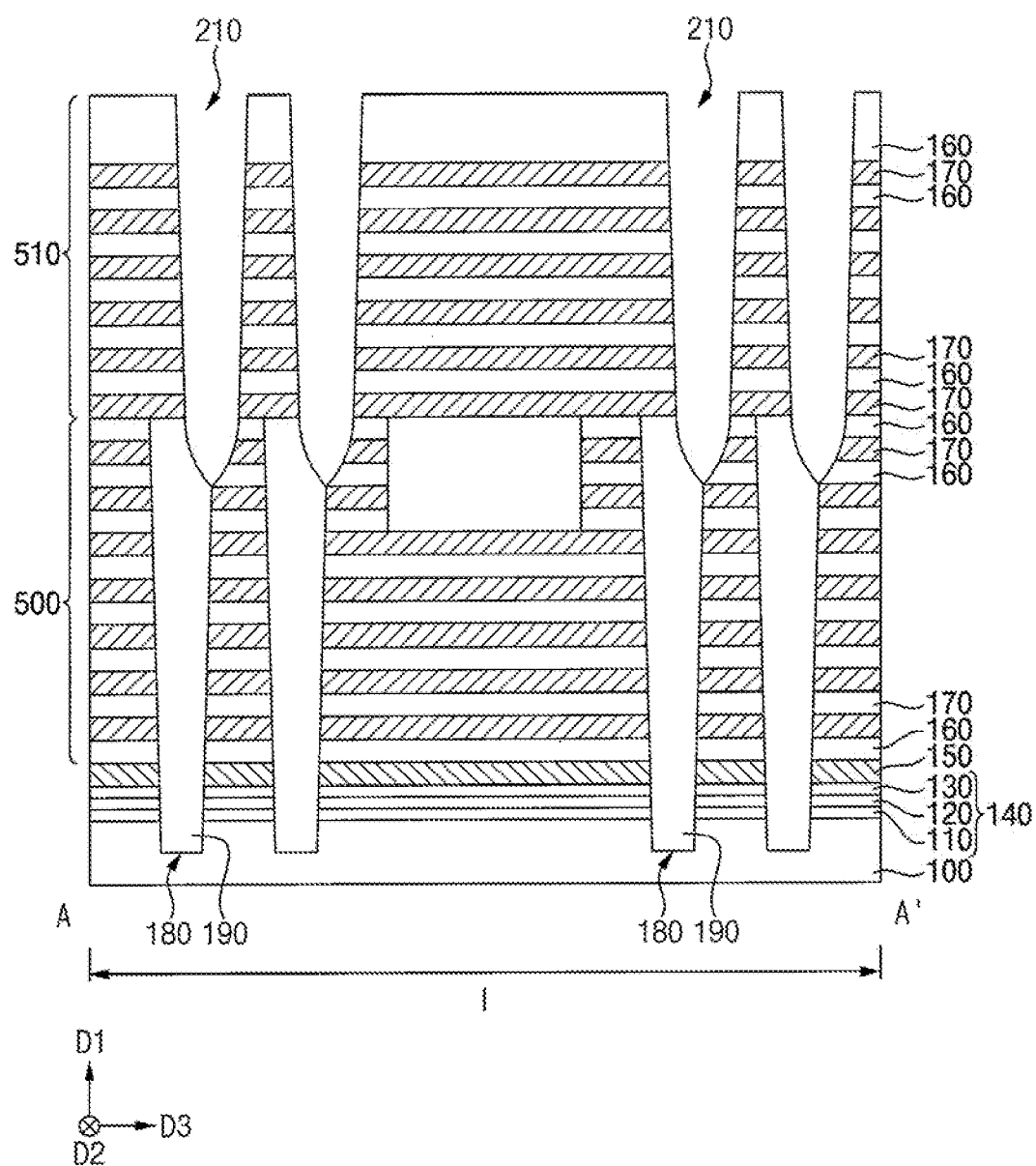

Referring to FIG. 9, the first insulation layer 160 and the fourth sacrificial layer 170 may be alternately and repeatedly stacked in the first direction D1 on the first mold layer 500, the fifth sacrificial patterns 190, and the etch stop layer 200 to form a second mold layer 510.

FIG. 9 shows the second mold layer 510 includes the first insulation layers 160 and the fourth sacrificial layers 170 stacked at 6 levels, respectively, but the second mold layer 510 may include the first insulation layers 160 and the fourth sacrificial layers 170 at more than 6 levels, respectively. An uppermost one of the first insulation layers 160 may have a thickness greater than those of other ones of the first insulation layers 160 in the second mold layer 510.

A second channel hole 210 may be formed through the second mold layer 510 to expose an upper surface of the fifth sacrificial pattern 190.

A photoresist pattern (not shown) may be formed on an uppermost one of the first insulation layers 160 included in the second mold layer 510. The first insulation layers 160 and the fourth sacrificial layers 170 of the second mold layer 510 may be etched using the photoresist pattern as an etching mask to form the second channel hole 210 exposing the upper surface of the fifth sacrificial pattern 190. In an example embodiment, a plurality of second channel holes 210 may be formed in each of the second and third directions D2 and D3 correspondingly to the first channel hole 180, and a second channel hole array may be defined.

In an example embodiment, due to the characteristics of the etching process, each of the second channel holes 210 may have a width gradually decreasing from a top toward a bottom thereof. Additionally, a width of a bottom of each of the second channel holes 210 may be less than a width of a top of a corresponding one of the first channel holes 180, i.e., a width of an upper surface of a corresponding one of the fifth sacrificial patterns 190.

In an example embodiment, each of the second channel holes 210 may be well-aligned with the fifth sacrificial pattern 190 in a corresponding one of the first channel holes 180, however, some of the second channel holes 210 may not be well-aligned therewith, and in the drawing, misaligned second channel holes 210 are shown. Due to the misaligned second channel holes 210, portions of the first insulation layers 160 and the fourth sacrificial layers 170 at upper sidewalls of the fifth sacrificial patterns 190 may be removed.

Figure 10:
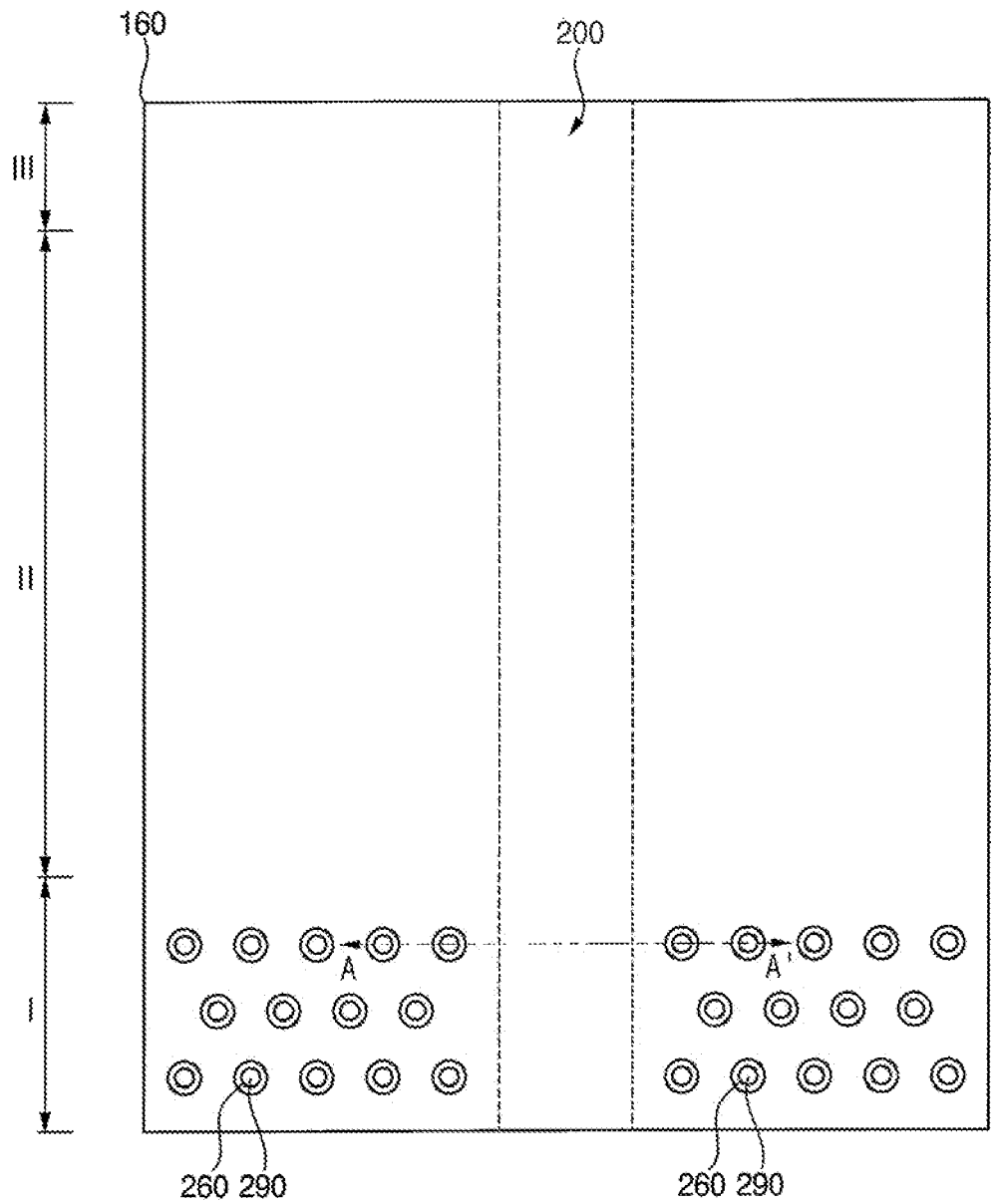
Figure 11:
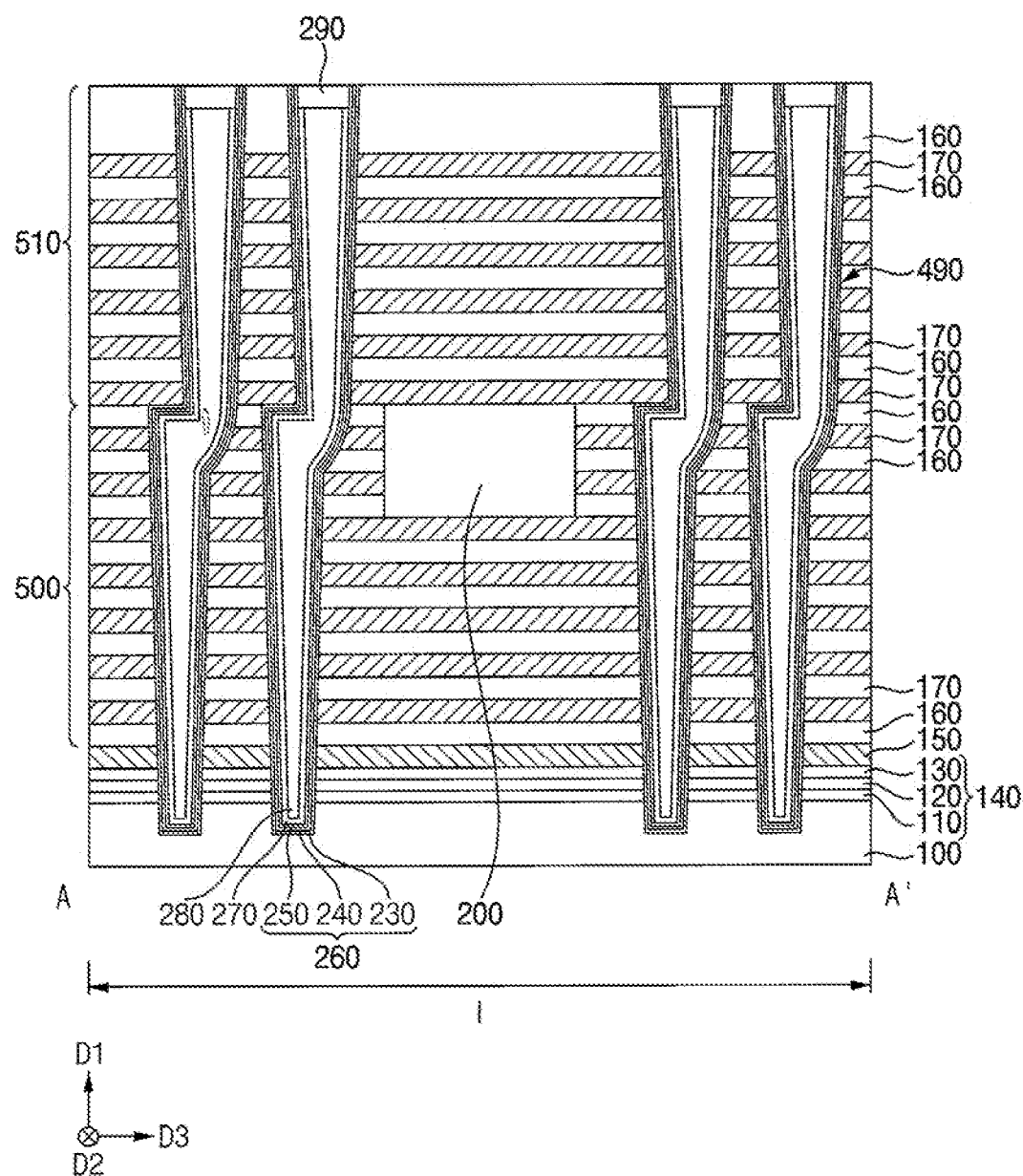

Referring to FIGS. 10 and 11, the fifth sacrificial patterns 190 exposed by the second channel holes 210 may be removed by, e.g., a wet etching process to form the first channel holes 180 again.

As described above, if the second channel holes 210 are not well-aligned with corresponding ones of the first channel holes 180, respectively, a distance between upper sidewalls of the first channel holes 180 may be reduced when compared to an original distance between upper sidewalls of the first channel holes 180.

A charge storage structure layer may be formed on sidewalls of the first and second channel holes 180 and 210, on the upper surface of the first substrate 100 exposed by the first channel hole 180, and on the upper surface of the uppermost one of the first insulation layers 160 in the second mold layer 510. A channel layer may be formed on the charge storage structure layer. A filling layer may be formed on the channel layer to fill the first and second channel holes 180 and 210.

The channel layer may include, e.g., undoped polysilicon. The filling layer may include an oxide, e.g., silicon oxide. The charge storage structure layer may include a first blocking layer, a charge storage layer, and a tunnel insulation layer sequentially stacked from inner walls of the first and second channel holes 180 and 210. For example, the first blocking layer, the charge storage layer, and the tunnel insulation layer may include an oxide, e.g., silicon oxide, a nitride, e.g., silicon nitride, and an oxide, e.g., silicon oxide, respectively.

The filling layer, the channel layer, and the charge storage structure layer may be planarized until the upper surface of the uppermost one of the insulation layers 160 in the second mold layer 510 is exposed, so that a filling pattern 280, a channel 270, and a charge storage structure 260 may be formed in the first and second channel holes 180 and 210. The charge storage structure 260 may include a first blocking pattern 230, a charge storage pattern 240, and a tunnel insulation pattern 250 sequentially stacked from the inner walls of the first and second channel holes 180 and 210 and the upper surface of the first substrate 100.

In an example embodiment, the filling pattern 280 may have a pillar shape extending in the first direction D1, the channel 270 may have a cup-like shape covering a sidewall and a lower surface of the filling pattern 280, and the charge storage structure 260 may have a cup-like shape covering an outer sidewall and a lower surface of the channel 270.

As discussed above, the first and second channel hole arrays may be defined, and thus the channels 270 therein may define a channel array.

Upper portions of the filling pattern 280 and the channel 270 may be removed to form a trench, and a pad 290 may be formed to fill the trench. In an example embodiment, the pad 290 may include, e.g., polysilicon doped with impurities or amorphous silicon doped with impurities. If the pad 290 includes amorphous silicon doped with impurities, a crystallization process may be further performed.

The filling pattern 280, the channel 270, the charge storage structure 260, and the pad 290 may form a memory channel structure 490 having a pillar shape, which may correspond to the memory channel structures 3220 and 4220 shown in FIGS. 3 and 4.

Figure 12:
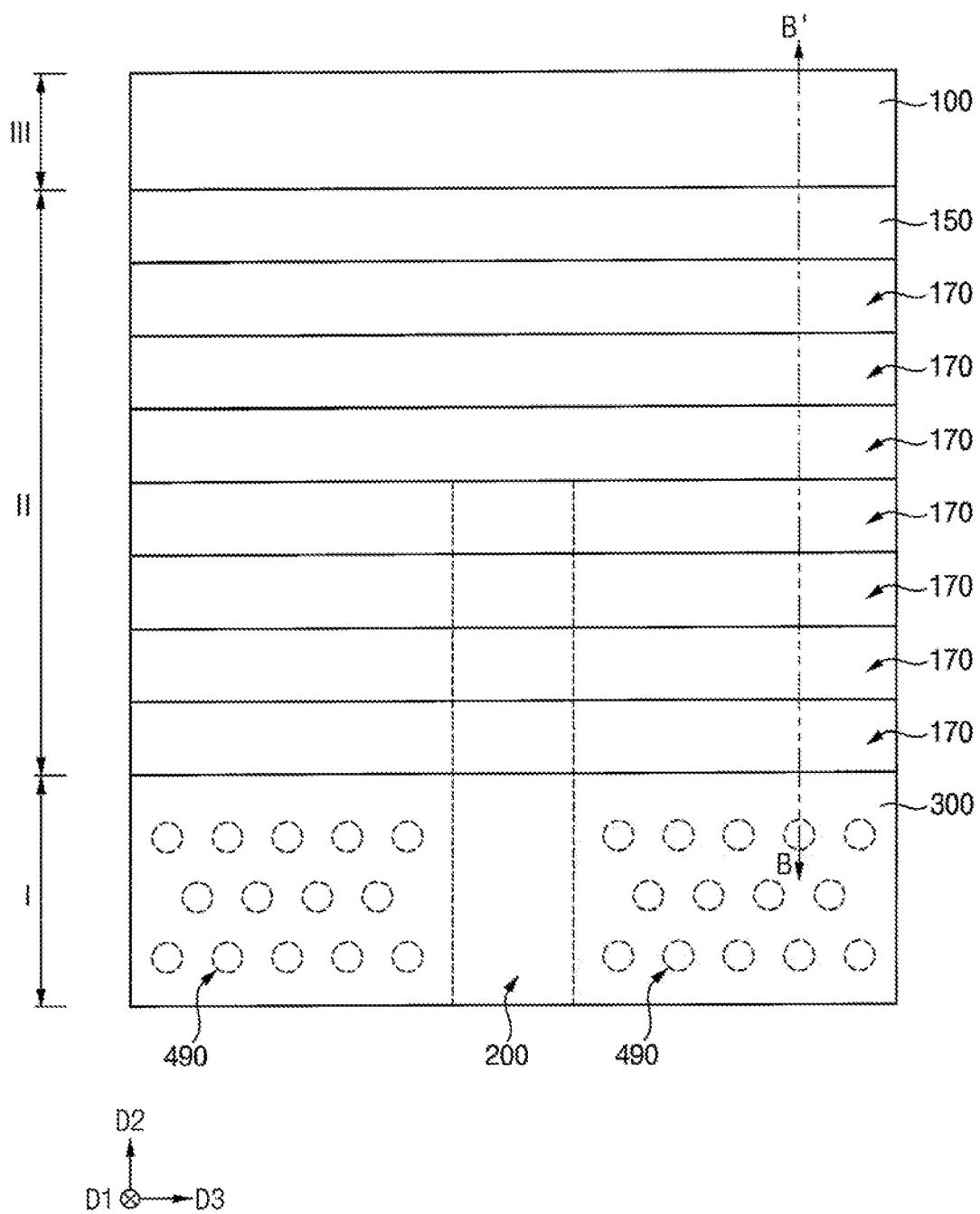
Figure 13:
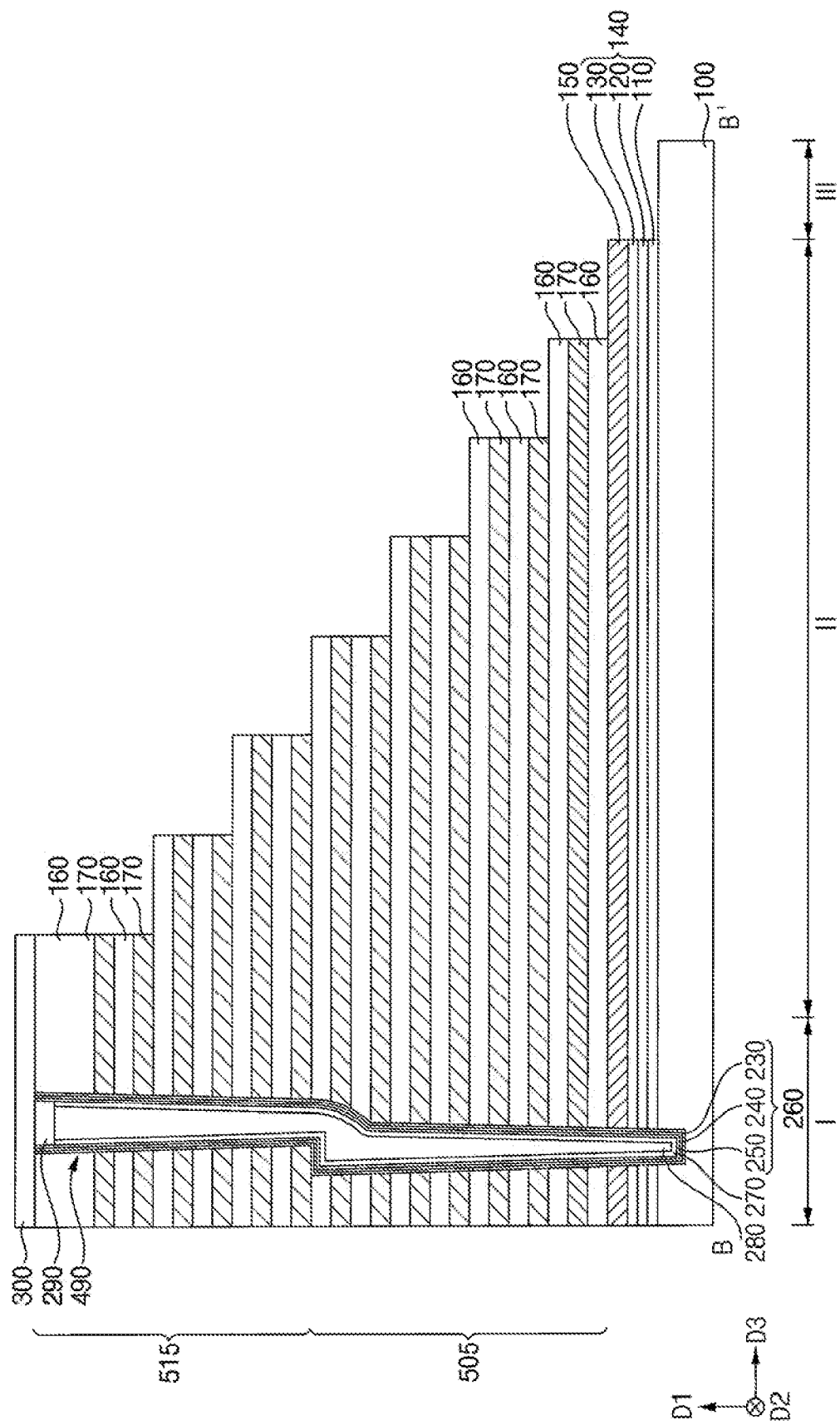

Referring to FIGS. 12 and 13, a first insulating interlayer 300 including an oxide, e.g., silicon oxide, may be formed on the first insulation layer 160, the pad 290, and the charge storage structure 260. A photoresist layer (not shown) may be formed on the first insulating interlayer 300. A photo process may be performed on the photoresist layer to form a photoresist pattern (not shown). The first insulating interlayer 300, the uppermost one of the first insulation layers 160, and an uppermost one of the fourth sacrificial layers 170 may be etched using the photoresist pattern as an etching mask. Thus, a portion of one of the insulation layers 160 under the uppermost one of the fourth sacrificial layers 170 may be exposed. After performing a trimming process for reducing an area of the photoresist pattern, the first insulating interlayer 300, the uppermost one of the insulation layers 160, the uppermost one of the fourth sacrificial layers 170, the exposed first insulation layer 160, and one of the fourth sacrificial layers 170 thereunder may be etched using the reduced photoresist pattern as an etching mask.

The trimming process and the etching process may be repeatedly performed to form first and second molds 505 and 515 sequentially stacked in the first direction D1 on the first and second regions I and II of the first substrate 100. Each of the first and second molds 505 and 515 may include a plurality of step layers each of which may include one fourth sacrificial layer 170 and one first insulation layer 160 sequentially stacked, and may have a staircase shape. An end portion in the second direction D2 of each of the step layers may not be overlapped with upper step layers in the first direction D1 so as to be exposed, which may be referred to as a "step." In an example embodiment, the steps of the first and second molds 505 and 515 may be formed in the second region II of the first substrate 100, and may be disposed in each of the second direction D2 and/or third direction D3.

A portion of the support layer 150 may not be covered by the first and second molds 505 and 515, but may instead be exposed.

In general, when the first and second mold layers 500 and 510 stacked in the first direction D1 are patterned to form the first and second molds 505 and 515 having staircase shapes, photoresist layers are formed on the first mold layer 500 and the second mold layer 510, respectively, and photo processes are performed on the respective photoresist layers to form photoresist patterns, respectively. Trimming processes and etching process are performed on the respective photoresist patterns and the respective first and second mold layers 500 and 510 to independently form steps in the first and second mold layers 500 and 510. However, in an example embodiment, when the first and second mold layers 500 and 510 stacked in the first direction D1 are patterned to form steps in the first and second mold layers 500 and 510, a photoresist layer may be formed on the second mold layer 510, and a photo process may be performed on the photoresist layer to form a photoresist pattern. Trimming processes and etching processes may be performed on the photoresist pattern and the first and second mold layers 500 and 510 to continuously form steps in the first and second mold layers 500 and 510. Accordingly, the number of photo process for forming the first and second molds 505 and 515 may be reduced.

Figure 14:
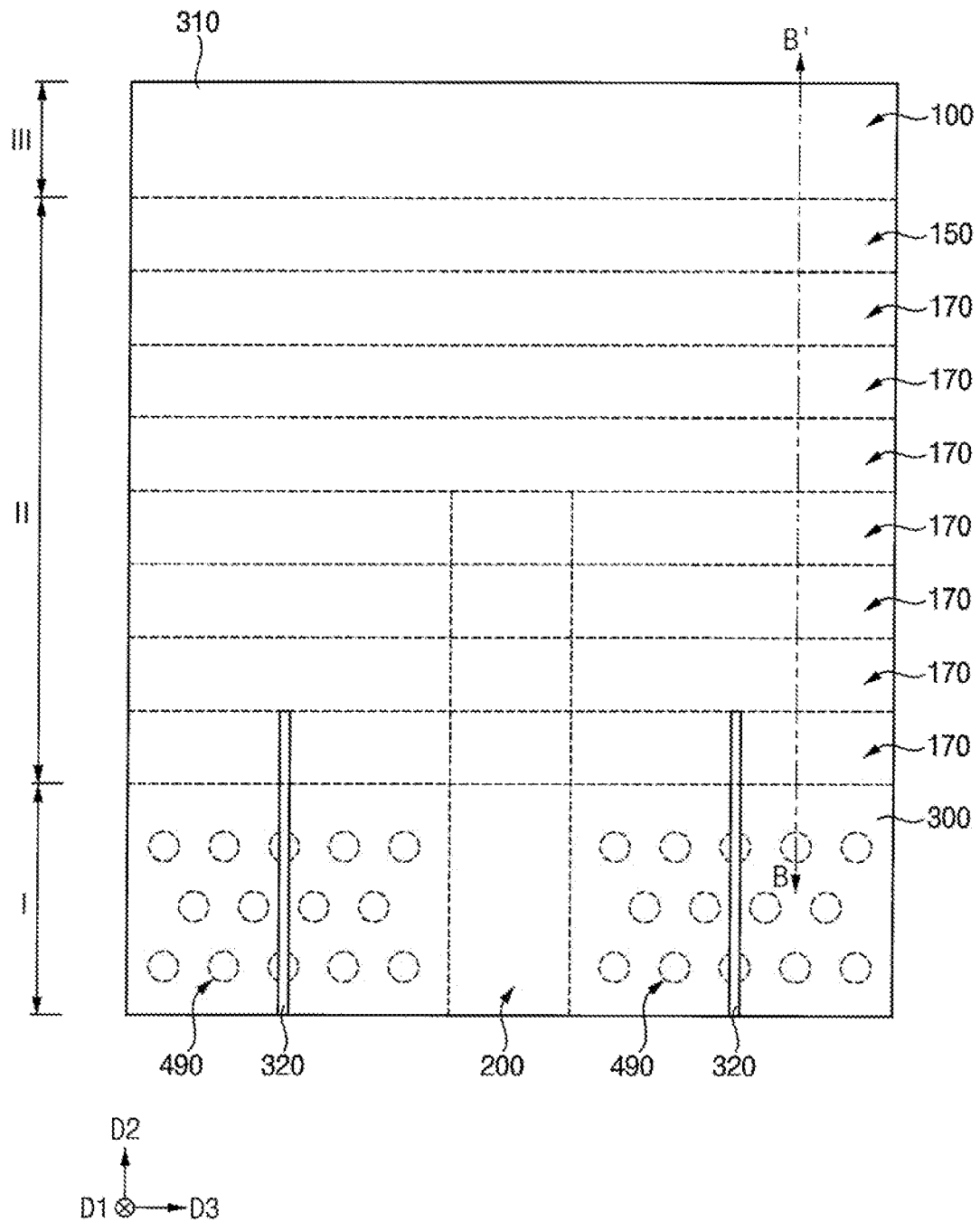
Figure 15:
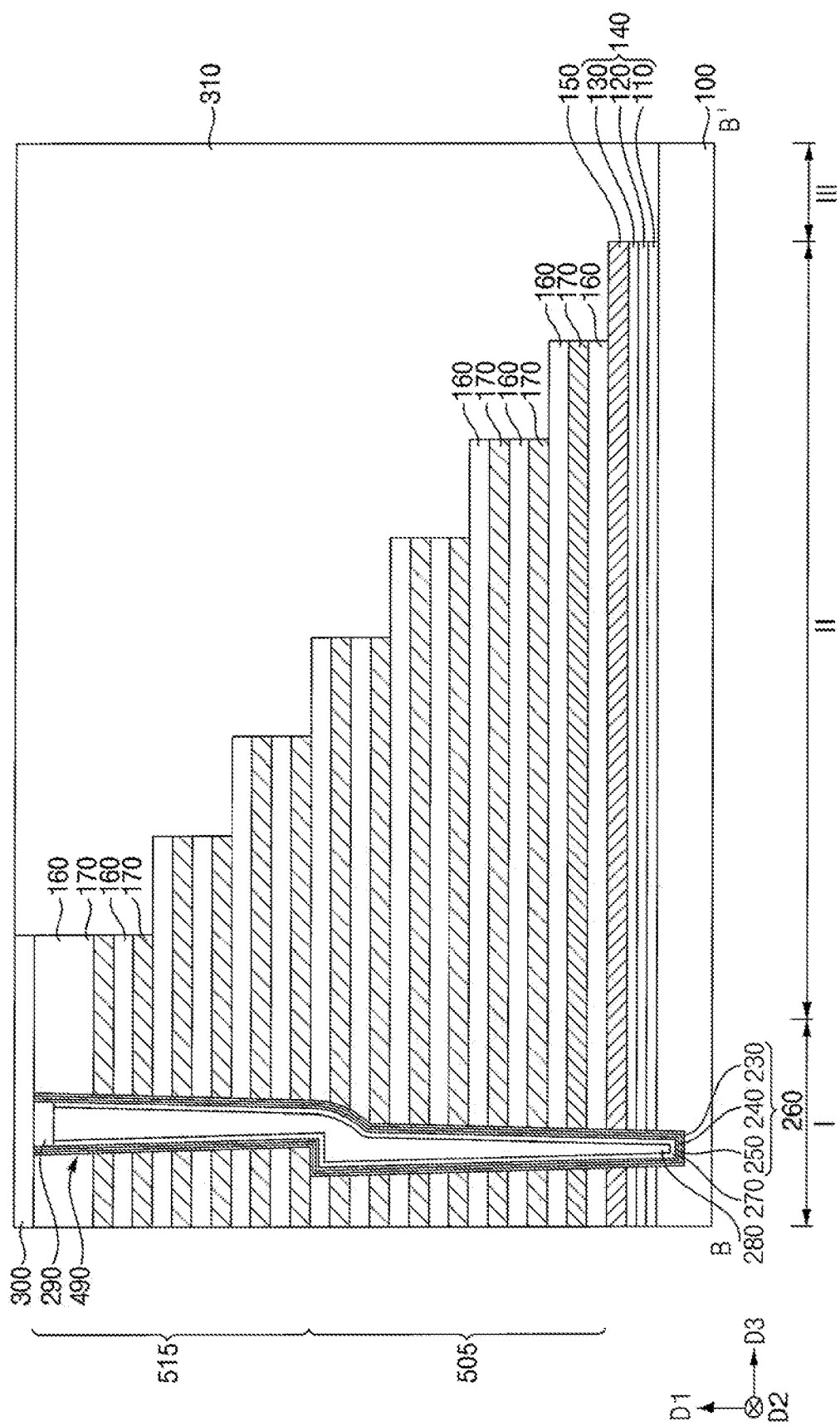

Referring to FIGS. 14 and 15, a second insulating interlayer 310 including an oxide, e.g., silicon oxide, may be formed on the first substrate 100 having the sacrificial layer structure 140, the support layer 150, and the first and second molds 505 and 515 thereon. An upper portion of the second insulating interlayer 310 may be planarized until the upper surface of the first insulating interlayer 300 is exposed.

Thus, sidewalls of the first and second molds 505 and 515, the exposed upper surface of the support layer 150, sidewalls of the support layer 150 and the sacrificial layer structure 140, and a sidewall of the first insulating interlayer 300 may be covered by the second insulating interlayer 310.

The first insulating interlayer 300 and some of the first insulation layers 160 and the fourth sacrificial layers 170 may be etched to form a second opening extending in the second direction D2. A first division pattern 320 may be formed in the second opening.

The first division pattern 320 (see FIG. 14) may extend in the second direction D2 on the first and second regions I and II of the first substrate 100, and may extend through, e.g., upper two steps of the second mold 515. Thus, the fourth sacrificial layers 170 at two upper levels of the second mold 515 may be divided in the third direction D3 by the first division pattern 320. In an example embodiment, the first division pattern 320 may extend through upper portions of some of the memory channel structures 490.

Figure 16:
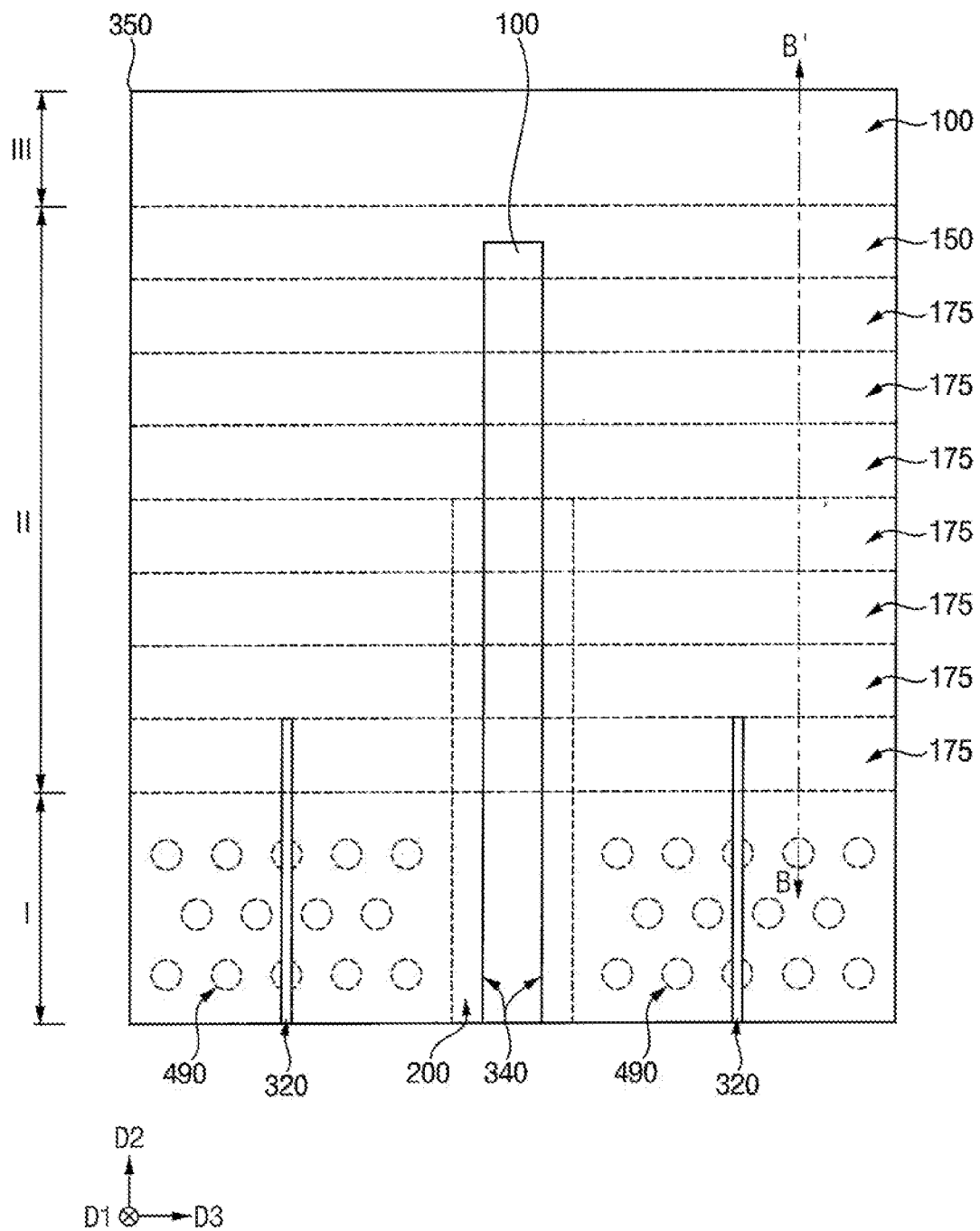
Figure 17:
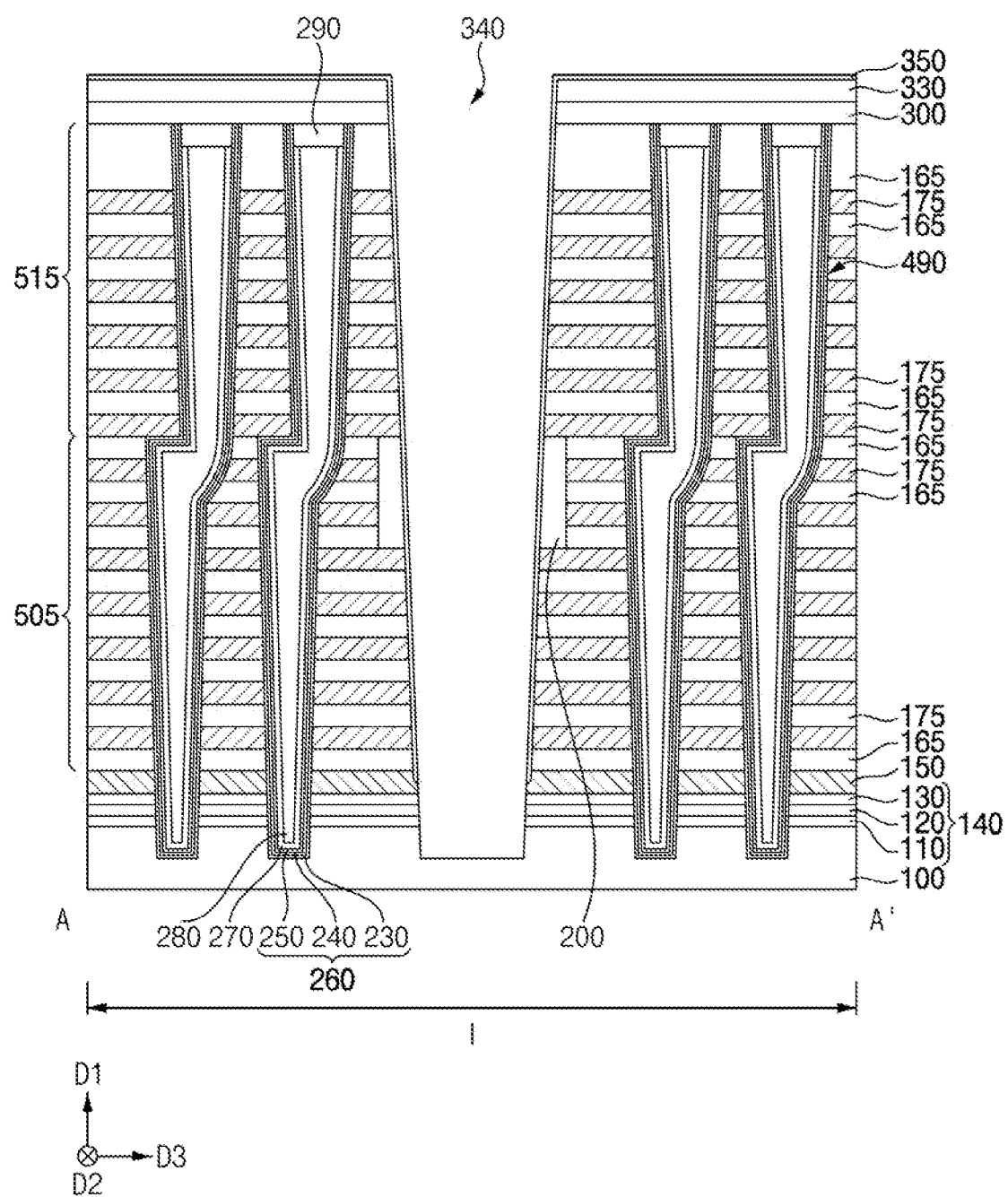

Referring to FIGS. 16 and 17, a third insulating interlayer 330 may be formed on the first and second insulating interlayers 300 and 310 and the first division pattern 320. A third opening 340 may be formed through the first to third insulating interlayers 300, 310, and 330 and the first and second molds 505 and 515 by, e.g., a dry etching process.

In an example embodiment, the dry etching process may be performed until an upper surface of the support layer 150 or an upper surface of the support pattern is exposed, and an upper portion of the support layer 150 or an upper portion of the support pattern may be also removed during the dry etching process. In an example embodiment, the third opening 340 may extend in the second direction D2 on the first and second regions I and II of the first substrate 100, and a plurality of third openings 340 may be formed in the third direction D3. As the third opening 340 is formed, the insulation layers 160 and the fourth sacrificial layers 170 of each of the first and second molds 505 and 515 may be transformed into a first insulation pattern 165 and a fourth sacrificial pattern 175, each of which may extend in the second direction D2.

As the third opening 340 is formed, the first insulation layers 160 and the fourth sacrificial layers 170 included in the first and second molds 505 and 515 may be exposed. However, in example embodiments, the third opening 340 may extend through the etch stop layer 200 in the first mold 505, and may have a width in the third direction D3 less than a width in the third direction D3 of the etch stop layer 200. Thus, even though the third opening 340 is formed, the etch stop layer 200 may not be entirely removed, and may partially remain at each of opposite sides in the third direction D3 of the third opening 340. As a result, sidewalls of the fourth sacrificial layers 170 and the first insulation layers 160 at a level at which the etch stop layer 200 is formed may not be exposed by the third opening 340, but instead may be covered by the remaining etch stop layer 200.

A spacer layer may be formed on a sidewall of the third opening 340 and the third insulating interlayer 330, and may be anisotropically etched so that a portion of the spacer layer on a bottom of the third opening 340 may be removed to form a spacer 350. Thus, the support layer 150 and the support pattern may be partially exposed.

The exposed support layer 150 and the support pattern and a portion of the sacrificial layer structure 140 thereunder may be removed to enlarge the third opening 340 downwardly. Accordingly, the third opening 340 may expose an upper surface of the first substrate 100, and further extend through an upper portion of the first substrate 100.

In an example embodiment, the spacer 350 may include, e.g., undoped amorphous silicon or undoped polysilicon. If the spacer 350 includes undoped amorphous silicon, the spacer 350 may be crystallized by heat generated during deposition processes of other layers, so as to include undoped polysilicon.

When the sacrificial layer structure 140 is partially removed, the sidewall of the third opening 340 may be covered by the spacer 350. Thus, the first insulation pattern 165, the fourth sacrificial pattern 175, and the etch stop layer 200 included in the first and second molds 505 and 515 may not be removed.

Figure 18:
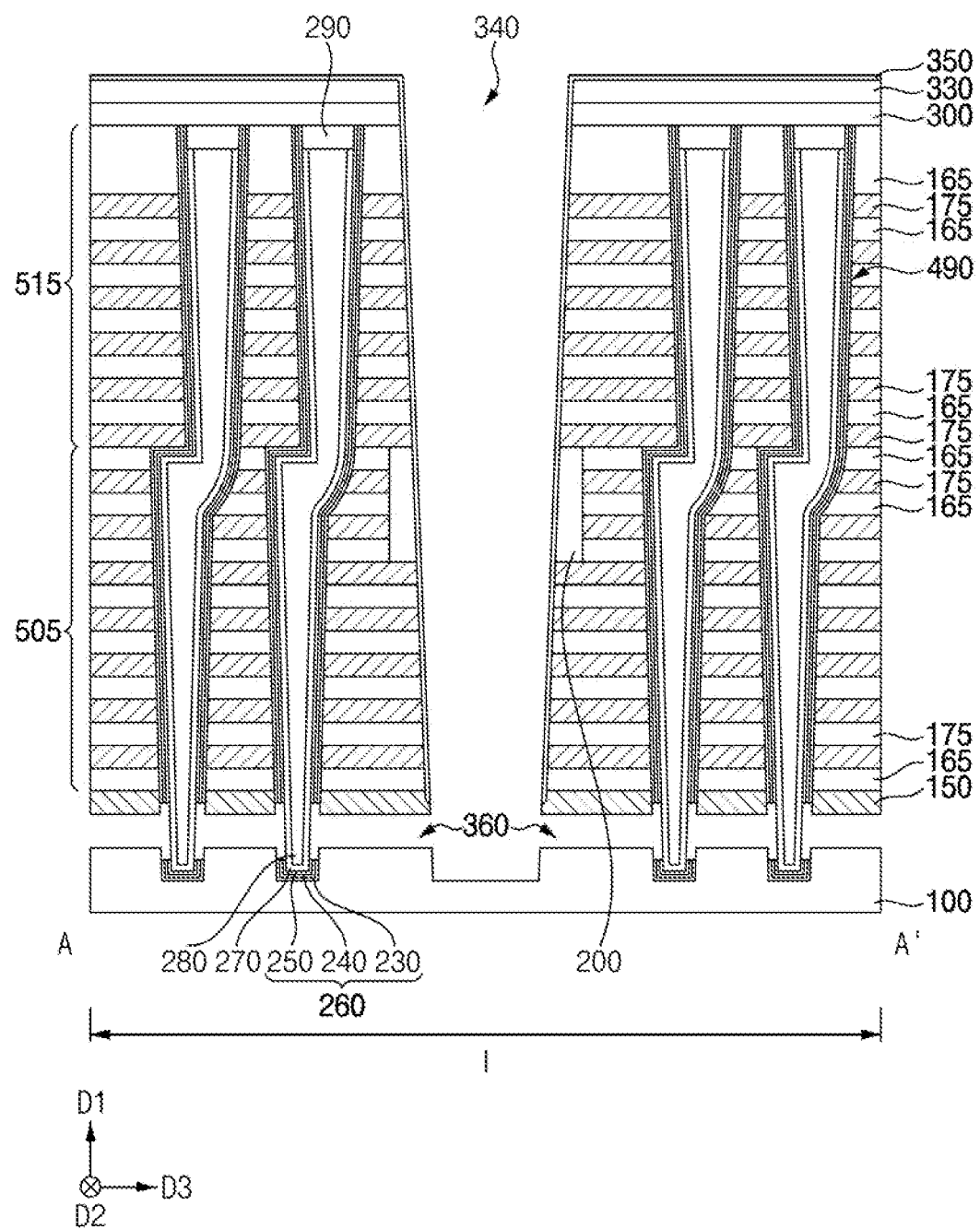

Referring to FIG. 18, the sacrificial layer structure 140 exposed by the third opening 340 may be removed by, e.g., a wet etching process, to form a first gap 360.

The wet etching process may be performed using, e.g., hydrofluoric acid or phosphoric acid.

As the first gap 360 is formed, a lower portion of the support layer 150 and an upper portion of the first substrate 100 adjacent to the third opening 340 may be exposed. Additionally, a sidewall of the charge storage structure 260 may be partially exposed by the first gap 360, and the exposed sidewall of the charge storage structure 260 may be also removed to expose an outer sidewall of the channel 270. Accordingly, the charge storage structure 260 may be divided into an upper portion extending through the first and second molds 505 and 515 to cover most portion of the outer sidewall of the channel 270, and a lower portion covering a lower surface of the channel 270 on the first substrate 100.

When the first gap 360 is formed by the wet etching process, the support layer 150 and the support pattern may not be removed. Thus, the first and second molds 505 and 515 may not lean or collapse.

Figure 19:
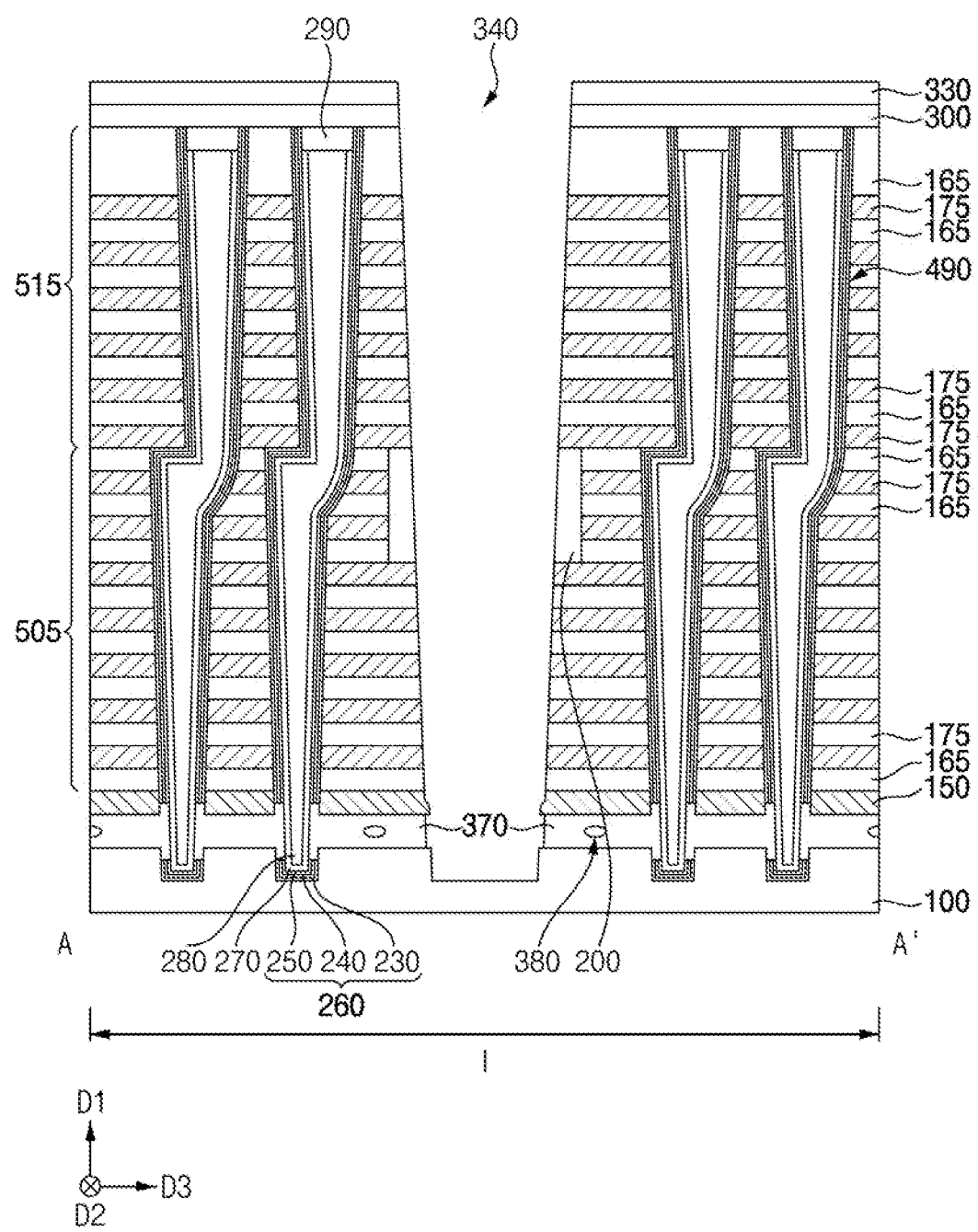

Referring to FIG. 19, after removing the spacer 350, a channel connecting layer may be formed on the sidewall of the third opening 340 and in the first gap 360. A portion of the channel connecting layer in the third opening 340 may be removed to form a channel connection pattern 370 in the first gap 360.

As the channel connection pattern 370 is formed, the channels 270 between neighboring ones of the third openings 340 in the third direction D3 may be connected with each other.

The channel connection pattern 370 may include, e.g., amorphous silicon doped with n-type impurities. The channel connection pattern 370 may be crystallized later during other deposition processes so as to include polysilicon.

An air gap 380 may be formed in the channel connection pattern 370.

Figure 20:
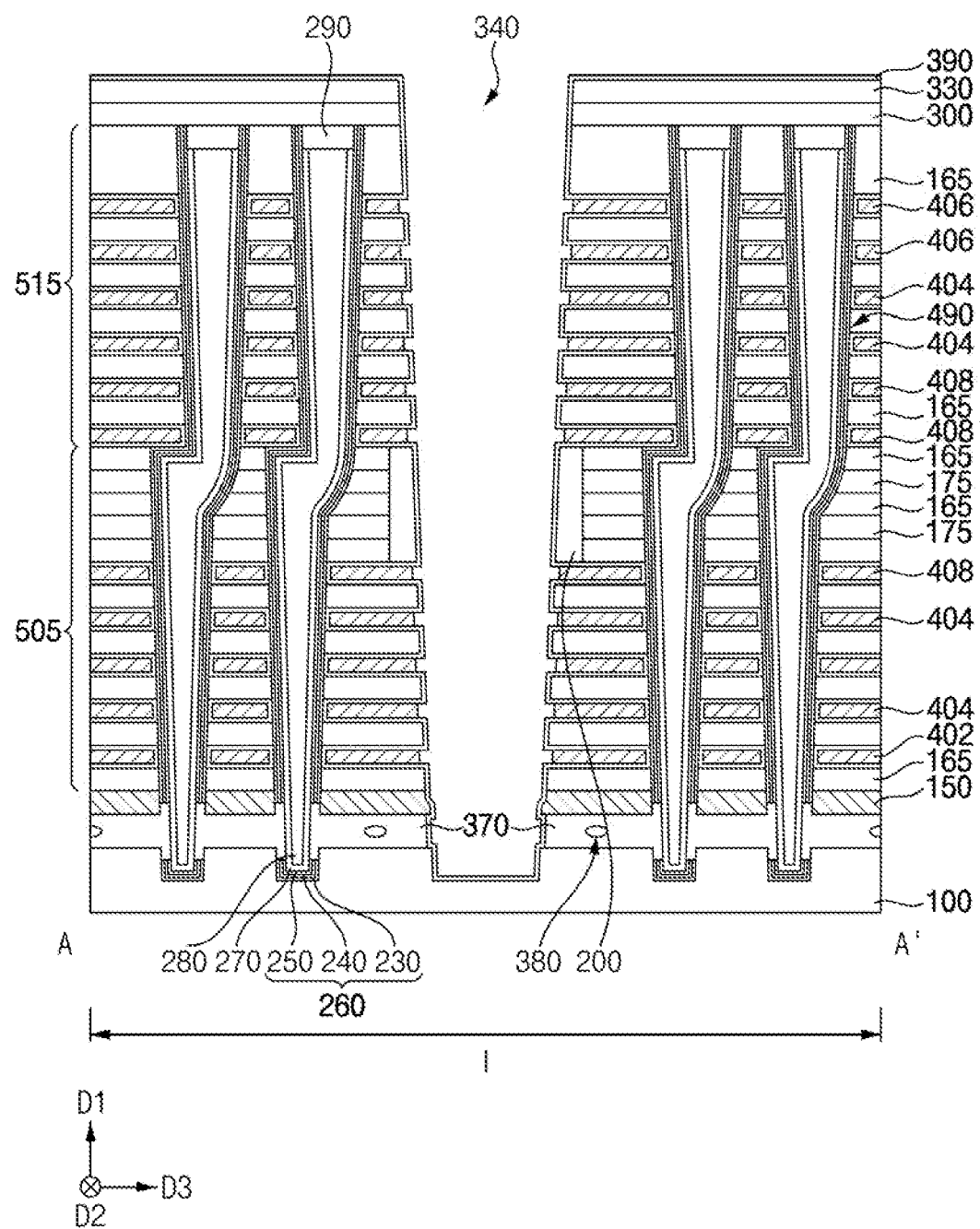

Referring to FIG. 20, the fourth sacrificial patterns 175 exposed by the third opening 340 may be removed to form a second gap between the first insulation patterns 165. An outer sidewall of the first blocking pattern 230 may be partially exposed by the second gap.

In an example embodiment, the fourth sacrificial patterns 175 may be removed by a wet etching process using, e.g., phosphoric acid ($H_3PO_4$) or sulfuric acid ($H_2SO_4$).

A second blocking layer 390 may be formed on the exposed outer sidewall of the first blocking pattern 230, inner walls of the second gaps, surfaces of the first insulation patterns 165, a sidewall and an upper surface of the support layer 150, a sidewall of the support pattern, a sidewall of the channel connection pattern 370, the upper surface of the first substrate 100, and an upper surface of the third insulating interlayer 330. A gate electrode layer may be formed on the second blocking layer 390.

In an example embodiment, the second blocking layer 390 may include a metal oxide, e.g., aluminum oxide, hafnium oxide, zirconium oxide, etc. The gate electrode layer may include a gate barrier layer and a gate conductive layer sequentially stacked. The gate electrode layer may include a low resistance metal, e.g., tungsten, titanium, tantalum, platinum, etc. The gate barrier layer may include a metal nitride, e.g., titanium nitride, tantalum nitride, etc.

The gate electrode layer may be partially removed to form a gate electrode in each of the second gaps. In an example embodiment, the gate electrode layer may be partially removed by a wet etching process.

In an example embodiment, the gate electrode may extend in the second direction D2, and a plurality of gate electrodes may be spaced apart from each other in the first direction D1 to form a gate electrode structure. Additionally, a plurality of gate electrode structures may be formed in the third direction D3.

Thus, the gate electrode structures may be spaced apart from each other in the third direction D3 by the third opening 340.

In an example embodiment, the gate electrode structure may include first, second, and third gate electrodes 402, 404, and 406 sequentially stacked in the first direction D1. A fourth gate electrode 408 may be further formed at levels above and below the fourth sacrificial patterns 175 that may be covered by the etch stop layer 200 and thus not removed by the wet etching process. Additionally, a fifth gate electrode may be further formed at levels above the third gate electrode 406 or below the first gate electrode 402, and may perform a body erase using the GIDL phenomenon. The gate electrode structure may correspond to the gate electrode structures 3210 and 4210 shown in FIGS. 3 and 4.

In an example embodiment, the first gate electrode 402 may serve as a ground selection line (GSL), and the third gate electrode 406 may serve as a string selection line (SSL). In the drawing, the first gate electrode 402 is formed at a lowermost level, and the third gate electrode 406 is formed at an uppermost level and a second level from above, but each of the first and third gate electrodes 402 and 406 may be formed at one or a plurality of levels. The second gate electrode 404 may be formed at a plurality of levels between the first and third gate electrodes 402 and 406.

In the drawing, the fourth gate electrode 408 is formed at one level below and two levels above, respectively, relative to the remaining fourth sacrificial patterns 175, but the fourth gate electrode 408 may have the same structure as the second gate electrode 404, although no electrical signals may be applied thereto. Thus, the fourth gate electrode 408 may not serve as a word line, and thus may be referred to as a dummy word line.

Referring to FIGS. 21 to 23, impurities may be implanted into an upper portion of the first substrate 100 through a portion of the second blocking layer 390 on the bottom of the third opening 340 to form an impurity region (not shown). In an example embodiment, the impurities may include n-type impurities, e.g., phosphorus, arsenic, etc.

A division layer may be formed on the second blocking layer 390 to fill the third opening 340. An upper portion of the division layer may be planarized until an upper surface of the third insulating interlayer 330 is exposed to form a second division pattern 410. During the planarization process, a portion of the second blocking layer 390 on the upper surface of the third insulating interlayer 330 may be removed, and a remaining portion of the second blocking layer 390 may remain as a second blocking pattern 395.

The second division pattern 410 may extend in the second direction D2, and a plurality of second division patterns 410 may be formed in the third direction D3. The second division pattern 410 may include an oxide, e.g., silicon oxide.

A fourth insulating interlayer 420 including an oxide, e.g., silicon oxide, may be formed on the third insulating interlayer 330, the second division pattern 410, and the second blocking pattern 395. First contact plugs 432 may be formed to extend through the first, third, and fourth insulating interlayers 300, 330, and 420, the first insulation pattern 165, and the second blocking pattern 395, so as to contact corresponding ones of the first to third gate electrodes 402, 404, and 406, respectively. Second contact plugs 434 may be formed to extend through the second to fourth insulating interlayers 310, 330, and 420, the first insulation pattern 165 and the second blocking pattern 395, so as to contact corresponding ones of the fourth gate electrodes 408, respectively. A third contact plug 436 may be formed to extend through the second to fourth insulating interlayers 310, 330, and 420, so as to contact an upper surface of the first substrate 100. Fourth contact plugs 438 may be formed to extend through the first, third, and fourth insulating interlayers 300, 330, and 420, so as to contact corresponding ones of the pads 290, respectively. A fifth insulating interlayer 440 including an oxide, e.g., silicon oxide, may be formed on the fourth insulating interlayer 420. First to fourth wirings 452, 454, 456, and 458 may be formed to extend through the fifth insulating interlayer 440 to contact the first to fourth contact plugs 432, 434, 436, and 438, respectively. The layouts of the first to fourth contact plugs 432, 434, 436, and 438 and the first to fourth wirings 452, 454, 456, and 458 may be varied. The first to fourth contact plugs 432, 434, 436, and 438 and the first to fourth wirings 452, 454, 456, and 458 may include a metal, a metal nitride, a metal silicide, doped polysilicon, etc.

In an example embodiment, the fourth wiring 458 may extend in the third direction D3, and a plurality of fourth wirings 458 may be formed in the second direction D2. Each of the fourth wirings 458 may serve as a bit line of the semiconductor device.

The semiconductor device may be manufactured by the above processes.

As described above, the second mold layer 510 may be formed on the first mold layer 500, a photoresist layer may be formed on the second mold layer 510, a photo process may be performed on the photoresist layer to form a photoresist pattern, and a trimming process may be alternately and repeatedly performed on the photoresist pattern and an etching process using the photoresist pattern as an etching mask so that the first and second mold layers 500 and 510 may be patterned to form the first and second molds 505 and 515 having staircase shapes, respectively. Thus, the number of photo process may be reduced as compared to forming photoresist patterns on the first and second mold layers 500 and 510, respectively, and alternately and repeatedly performing the trimming process and the etching process on the first and second mold layers 500 and 510, respectively, to form the first and second molds 505 and 515.

As described above, an additional bonding layer may not be formed between the first and second mold layers 500 and 510. Thus, the continuity between the first and second mold layers 500 and 510 may be maintained. Thus, even though the first and second mold layers 500 and 510 are patterned using the same photoresist pattern, the first and second molds 505 and 515 may include steps having desired sizes and shapes.

The etch stop layer 200 may be formed through upper fourth sacrificial layers 170 among the fourth sacrificial layers 170 included in the first mold layer 500. Further, the second mold layer 510 may be formed on the first mold layer 500. Further, the third opening 340 (for replacing the fourth sacrificial layers 170 with the gate electrodes, respectively) may be formed to extend through the etch stop layer 200 while having a width that is less than that of the etch stop layer 200. Thus, when the fourth sacrificial layers 170 are removed through the third opening 340, ones of the fourth sacrificial layers 170 at the same level as the etch stop layer 200 may not be removed, but instead may remain.

In general, if at least some of the second channel holes 210 extending through the second mold layer 510 are not well-aligned but are misaligned with the first channel holes 180 extending through the first mold layer 500, a distance between neighboring ones of the memory channel structures 490 at an upper portion of the first mold layer 500 may be very small. Thus, the fourth sacrificial patterns 175 that are between the neighboring ones of the memory channel structures 490 may not be well removed, or the gate electrode may not be well formed in the second gap. Accordingly, the gate electrode may not be well formed in the second gap (which may deteriorate the electrical characteristics thereof) or etching gas remaining in the second gap may expand to a peripheral area in subsequent processes, and thus cause an electrical short between upper and lower gate electrodes.

However, according to an example embodiment, the etch stop layer 200 may be formed on the first mold layer 500. Thus, the fourth sacrificial patterns 175 that are at the same level as the etch stop layer 200 may not be exposed to the third opening 340, and thus may not be removed. Accordingly, the present example embodiment may prevent incomplete formation of the gate electrode and an electrical short between upper and lower gate electrodes.

The remaining fourth sacrificial patterns 175 may not serve as a gate electrode or a word line, and thus the remaining fourth sacrificial patterns 175 may be considered to form a dummy gate electrode or a dummy word line, and may be referred to as such in the following description.

If misalignment occurs between the first and second channel holes 180 and 210, the memory channel structures 490 in the first and second channel holes 180 and 210 may not have a uniform shape at a height where the etch stop layer 200 is formed in the first mold layer 500, and also at a lower portion of the second mold layer 510. Thus, in order to obtain uniform electrical characteristics, ones of the gate electrodes not only at the same level as the etch stop layer 200 but also at some levels above and below the level may not serve as word lines but may be dummy word lines, which may be referred to as the fourth gate electrodes 408.

Thus, each of the fourth gate electrodes 408 may have the same structure as the second gate electrode 404, although no electrical signals may be applied thereto. Thus, even though the second contact plugs 434 may be connected to the fourth gate electrodes 408, respectively, no wirings may be connected to the second contact plugs 434. In another example embodiment, no contact plugs may be connected to the fourth gate electrodes 408.

Each of the remaining fourth sacrificial patterns 175 may not have the same structure as the second gate electrode 404, but may include a nitride, e.g., silicon nitride. Additionally, no contact plug may be connected to the remaining fourth sacrificial patterns 175 so that no electrical signals may be applied thereto.

The vertical memory device formed by the above processes may have the following structural characteristics.

Referring to FIGS. 21 to 23, the vertical memory device may include the gate electrodes 402, 404, 406, 408, and 175 spaced apart from each other in the first direction D1 substantially perpendicular to the upper surface of the first substrate 100 to be stacked in a staircase shape. Further, the memory channel structure 490 may extend through the gate electrode structure. Further, the etch stop layer 200 may be disposed on a sidewall of the gate electrode overlapping a portion of the memory channel structure in a horizontal direction substantially parallel to the upper surface of the first substrate 100 so as to contact the dummy gate electrode 175 (which includes an insulating material) among the gate electrodes 402, 404, 406, and 408. Further, the first and second contact plugs 432 and 434 may be electrically connected to ones of the gate electrodes 402, 404, 406, 408, and 175 except for the dummy gate electrode 175. Further, the first wirings 452 may be electrically connected to the first contact plugs 432 and applying electrical signals thereto.

The memory channel structure 490 may include the channel 270, which may include a first portion extending through the first mold 505 in the first direction D1 on the first substrate 100 and a second portion extending through the second mold 515 in the first direction D1 from the first portion, and which may have a lower surface with a width that is less than that of an upper surface of the first portion. The memory channel structure 490 may further include the charge storage structure 260 on an outer sidewall of the channel 270. The memory channel structure 490 may further include the filling pattern 280 contacting an inner sidewall of the channel 270 and having a pillar shape. The memory channel structure 490 may further include the pad 290 on upper surfaces of the channel 270 and the filling pattern 280 and contacting an inner sidewall of the charge storage structure 260. The etch stop layer 200 may overlap the first portion of the channel 270 included in the memory channel structure 490 in the horizontal direction.

In an example embodiment, the dummy gate electrode 175 may include a nitride, and the etch stop layer 200 may include a material having an etching selectivity with respect to the dummy gate electrode 175, e.g., an oxide.

In an example embodiment, the second contact plug 434 (which is electrically connected to the gate electrode 408 above or below the dummy gate electrode 175 among the gate electrodes 402, 404, 406, 408, and 175) may not be connected to a wiring, and thus no electrical signals may be applied thereto. In an example embodiment, the gate electrode 408 may be formed at a plurality of levels, respectively.

In an example embodiment, each of the gate electrodes 402, 404, 406, 408, and 175 may extend in the second direction D2. End portions in the second direction D2 of the gate electrodes 402, 404, 406, 408, and 175 may form steps arranged in the second direction D2. In an example embodiment, the etch stop layer 200 may extend in the second direction D2. An end portion in the second direction D2 of the etch stop layer 200 may be aligned with an end portion in the second direction D2 of the dummy gate electrode 175 in a plan view.

In an example embodiment, the first portion of the channel 270 may have a cup-like shape. The second portion of the channel 270 may have a cylindrical shape connected to the first portion. In an example embodiment, a plurality of channels 270 may be formed in the second and third directions D2 and D3. A width of the first portion of at least some of the plurality of channels 270 (except for an upper portion thereof) may increase by a first increase rate from a bottom toward a top thereof. However, a width of the upper portion of the at least some of the plurality of channels 270 may increase by a second increase rate greater than the first increase rate from a bottom toward a top thereof.

Figure 24:
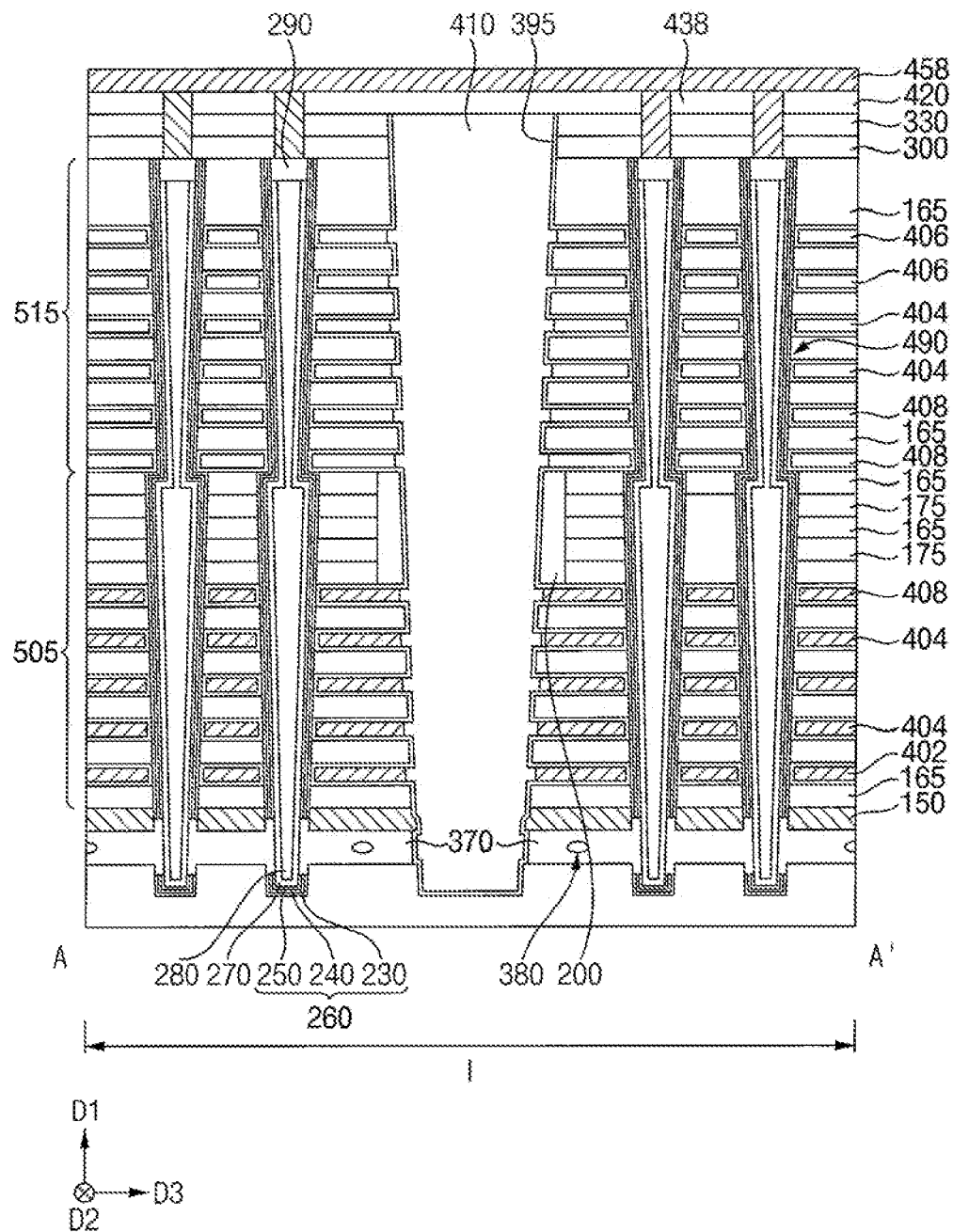
FIG. 24 is a cross-sectional view illustrating a semiconductor device in accordance with an example embodiment, which may correspond to FIG. 22.

FIG. 24 is a cross-sectional view illustrating a semiconductor device in accordance with an example embodiment, which may correspond to FIG. 22.

This semiconductor device may be substantially the same as or similar to that of FIGS. 21 to 23, except for the memory channel structure 490.

The memory channel structure 490 may include a lower portion in the first mold 505 and an upper portion in the second mold 515. A lower surface of the upper portion may have a width less than a width of an upper surface of the lower portion, and may be formed within an area of the upper surface of the lower portion in a plan view.

Thus, FIG. 24 shows at least some of the second channel holes 210 in the second mold 515 are well-aligned with the first channel holes 180 in the first mold 505.

Figure 25:
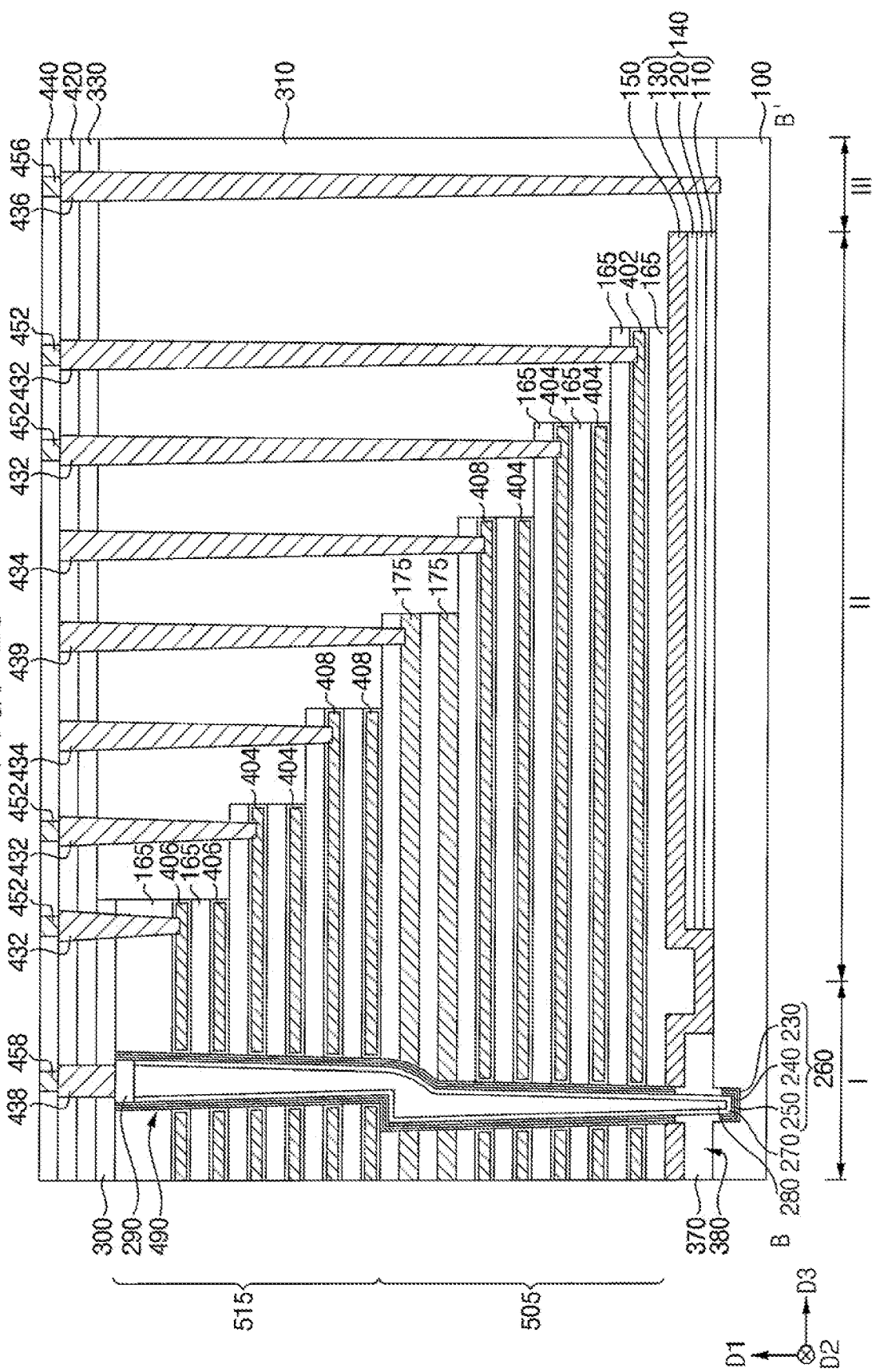
FIG. 25 is a cross-sectional view illustrating a semiconductor device in accordance with an example embodiment, which may correspond to FIG. 23.

FIG. 25 is a cross-sectional view illustrating a semiconductor device in accordance with an example embodiment, which may correspond to FIG. 23.

This semiconductor device may be substantially the same as or similar to that of FIGS. 21 to 23, except for a fifth contact plug 439.

The fifth contact plug 439 may extend through the second to fourth insulating interlayers 310, 330, and 420 and the first insulation pattern 165 so as to contact the fourth sacrificial pattern 175. However, the fifth contact plug 439 may not be connected to a wiring for applying electrical signals thereto. Thus, no electrical signals may be applied to the fourth sacrificial pattern 175, and thus the fourth sacrificial pattern 175 may serve as a dummy gate electrode or a dummy word line.

Figure 26:
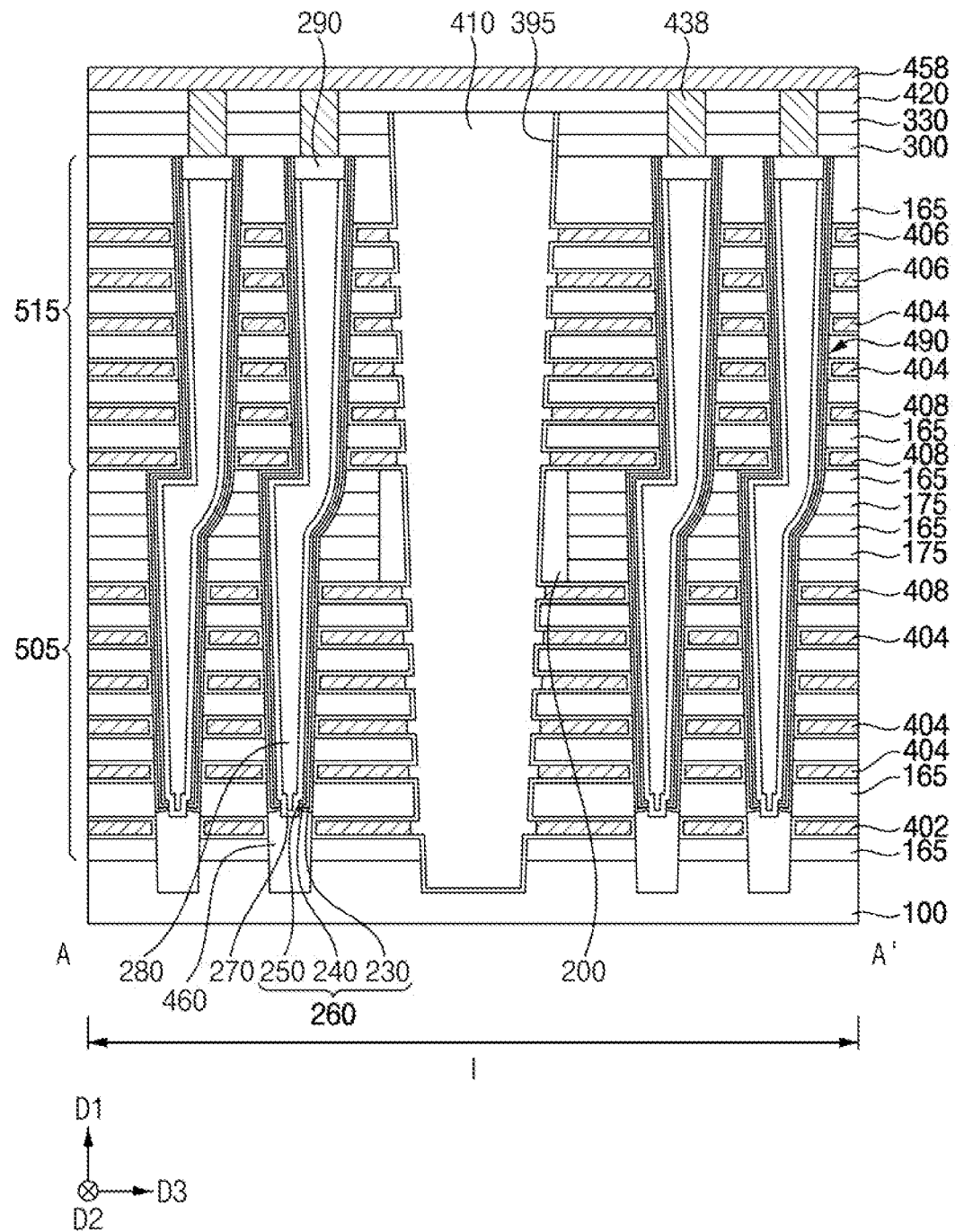
FIG. 26 is a cross-sectional view illustrating a semiconductor device in accordance with an example embodiment, which may correspond to FIG. 22.

FIG. 26 is a cross-sectional view illustrating a semiconductor device in accordance with an example embodiment, which may correspond to FIG. 22.

This semiconductor device may be substantially the same as or similar to that of FIGS. 21 to 23, except for the memory channel structure 490, the channel connection pattern 370, and the support layer 150.

The memory channel structure 490 may further include a semiconductor pattern 460 on the first substrate 100. The charge storage structure 260, the channel 270, the filling pattern 280, and the pad 290 may be formed on the semiconductor pattern 460.

The semiconductor pattern 460 may include, e.g., single crystalline silicon or polysilicon. In an example embodiment, an upper surface of the semiconductor pattern 460 may be located between heights of lower and upper surfaces of the first insulation pattern 165 between the first and second gate electrodes 402 and 404. The charge storage structure 260 may have a cup-like shape of which a central lower surface is opened on the upper surface of the semiconductor pattern 460, and may contact an edge upper surface of the semiconductor pattern 460. The channel 270 may have a cup-like shape, and may contact a central upper surface of the semiconductor pattern 460. Thus, the channel 270 may be electrically connected to the first substrate 100 through the semiconductor pattern 460.

The channel connection pattern 370 and the support layer 150 may not be formed between the first substrate 100 and the first gate electrode 402. In an example embodiment, one of the first insulation patterns 165 between the first and second gate electrodes 402 and 404 may have a thickness greater than those of other ones of the first insulation patterns 165.

Figure 27:
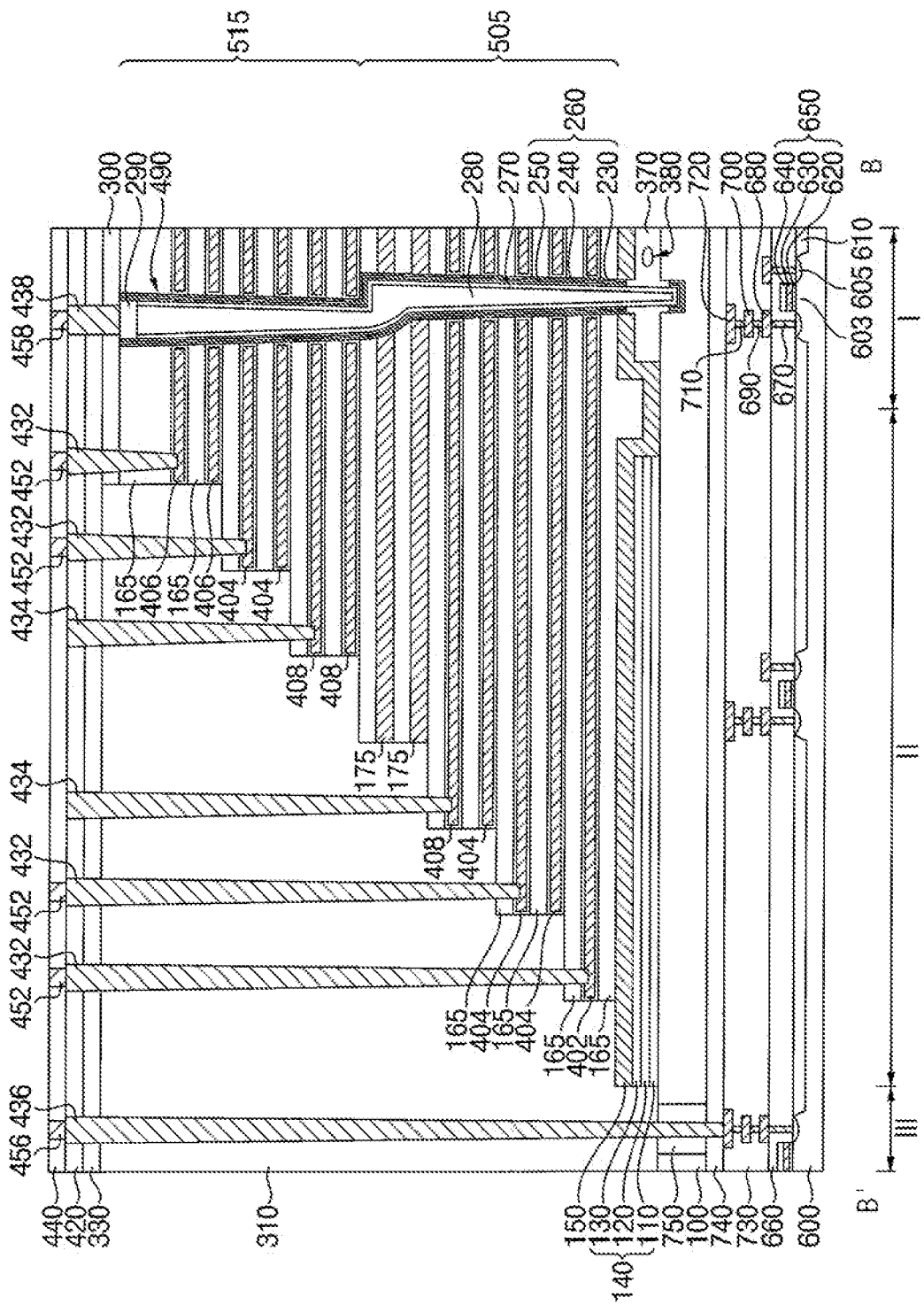
FIG. 27 is a cross-sectional view illustrating a semiconductor device in accordance with an example embodiment, which may correspond to FIG. 23.

FIG. 27 is a cross-sectional view illustrating a semiconductor device in accordance with an example embodiment, which may correspond to FIG. 23.

This semiconductor device may be substantially the same as or similar to that of FIGS. 21 to 23, except for further including a circuit structure having peripheral circuit wirings under the semiconductor device of FIG. 23. The peripheral circuit wirings may correspond to the peripheral circuit wirings 3110 of FIG. 3. The circuit structure may correspond to the first structure 3100 of FIG. 3.

In an example embodiment, the vertical memory device may have a cell-over-peri (COP) structure. Thus, a second substrate 600 and the peripheral circuit wirings may be formed under the first substrate 100, and hereinafter, the first to third regions I, II and III of the first substrate 100 may be defined in the second substrate 600 in the same way. The second substrate 600 may include a semiconductor material. An isolation pattern 610 may be formed on the second substrate 600. An active region 603 may be formed by the isolation pattern 610. The peripheral circuit wirings may include, e.g., transistors, lower contact plugs, lower wirings, lower vias, etc.

In an example embodiment, a transistor may be formed to include a lower gate structure 650 on the second substrate 600 and an impurity region 605 at an upper portion of the active region 603 adjacent thereto. The lower gate structure 650 may include a lower gate insulation pattern 620, a lower gate electrode 630, and a lower gate mask 640 sequentially stacked on the second substrate 600. In the drawing, one transistor is formed on each of the first to third regions I, II, and III of the second substrate 600, but the number of transistors may be varied.

A first lower insulating interlayer 660 may be formed on the second substrate 600 to cover the transistors. A lower contact plug 670 may be formed through the first lower insulating interlayer 660 to contact the impurity region 605. A first lower wiring 680 may be formed on the first lower insulating interlayer 660 to contact an upper surface of the lower contact plug 670. A first lower via 690, a second lower wiring 700, a second lower via 710, and a third lower wiring 720 may be sequentially stacked on the first lower wiring 680.

A second lower insulating interlayer 730 may be formed on the first lower insulating interlayer 660 to cover the first and second lower vias 690 and 710 and the first and second lower wirings 680 and 700, and to surround sidewalls of the third lower wirings 720.

The lower contact plug 670, the first and second lower vias 690 and 710, and the first to third lower wirings 680, 700 and 720 may include a conductive material, e.g., a metal, a metal nitride, a metal silicide, doped polysilicon, etc.

A third lower insulating interlayer 740 may be formed on the second lower insulating interlayer 730 and the third lower wiring 720. The first to third lower insulating interlayers 660, 730, and 740 may form a lower insulating interlayer structure, and may include substantially the same material, e.g., silicon oxide to be merged with each other.

A second insulation pattern 750 may be further formed in the first substrate 100. The third contact plug 436 may extend through the second insulation pattern 750 and the third lower insulating interlayer 740 on the first substrate 100 so as to contact and be electrically connected to one of the third lower wirings 720.

Figure 28:
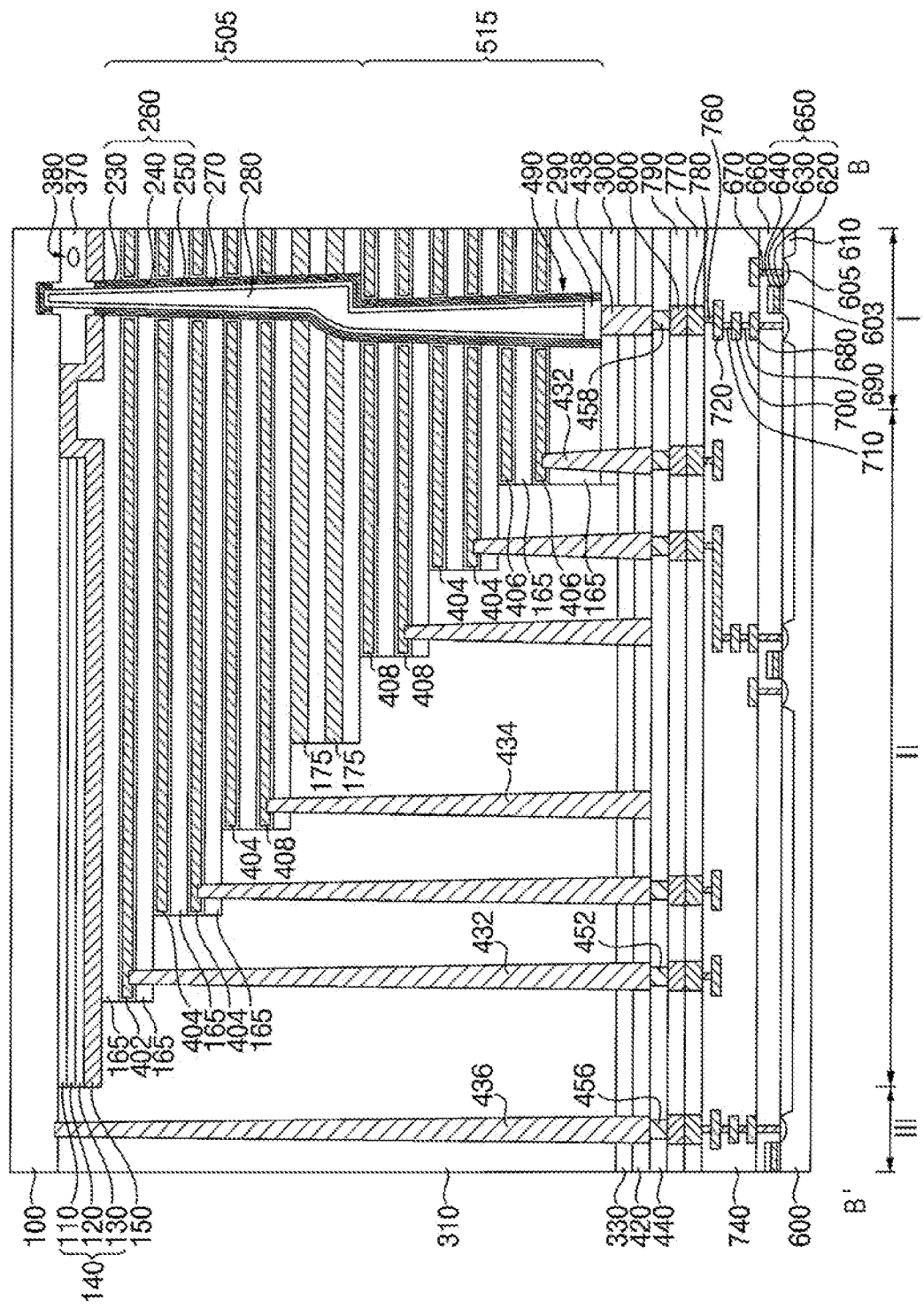
FIG. 28 is a cross-sectional view illustrating a semiconductor device in accordance with an example embodiment, which may correspond to FIG. 23.

FIG. 28 is a cross-sectional view illustrating a semiconductor device in accordance with an example embodiment, which may correspond to FIG. 23.

This semiconductor device may further include peripheral circuit wirings and a circuit structure including the peripheral circuit wirings with the semiconductor device of FIGS. 21 to 23 upside down, and may be substantially the same as or similar to that of FIGS. 21 to 23, except for the noted circuit structure. The peripheral circuit wirings may correspond to the peripheral circuit wirings 4110 of FIG. 4, and the circuit structure may correspond to the first structure 4100 of FIG. 4.

In an example embodiment, the second substrate 600 and the peripheral circuit wirings may be further formed under the semiconductor device of FIGS. 21 to 23. However, sequentially stacked fourth and fifth lower insulating interlayers 770 and 790 may be formed on the second lower insulating interlayer 730, instead of the third lower insulating interlayer 740. A third lower via 760 may be further formed in the second lower insulating interlayer 730.

The fourth and fifth lower insulating interlayers 770 and 790 may include an oxide, e.g., silicon oxide. First and second bonding structures 780 and 800 may be formed to extend through the fourth and fifth lower insulating interlayers 770 and 790. The first and second bonding structures 780 and 800 may correspond to the first and second bonding structures 4150 and 4250, respectively, and may include a metal, e.g., copper.

The third lower vias 760 may be formed on the third lower wirings 720, respectively, and may be electrically connected to the first bonding structures 780, respectively.

By way of summation and review, as a number of stacks of memory cells in a semiconductor device increases, the memory cells may not be easily formed through a single mold, and thus a plurality of molds may be stacked in a vertical direction. However, this may increase the number of photo processes for forming the plurality of molds, which may increase costs.

As described above, embodiments may provide a semiconductor device having improved characteristics. Embodiments may also provide an electronic system including a semiconductor device having improved characteristics.

In the method of manufacturing a semiconductor device in accordance with an example embodiment, when mold layers stacked in a vertical direction are patterned to form molds having a staircase shape, the mold layers may not be independently patterned but may be patterned by a same process, so as to reduce a number of photo processes used in forming a photoresist pattern. Additionally, gate electrodes that are formed by replacing portions of the molds may have enhanced electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
   a gate electrode structure on a substrate, the gate electrode structure including gate electrodes spaced apart from each other in a first direction perpendicular to an upper surface of the substrate and stacked in a staircase shape;
   a channel extending through the gate electrode structure, the channel including:
      a first portion extending in the first direction on the substrate; and
      a second portion extending in the first direction on and contacting the first portion, a lower surface of the second portion having a width less than a width of an upper surface of the first portion; and
   an etch stop layer on a sidewall of the gate electrode structure and contacting at least one gate electrode of the gate electrodes, the etch stop layer overlapping an upper portion of the first portion of the channel in a horizontal direction parallel to the upper surface of the substrate,
   wherein the at least one gate electrode contacting the etch stop layer is a dummy gate electrode including an insulating material.

2. The semiconductor device as claimed in claim 1, wherein the dummy gate electrode includes a nitride, and the etch stop layer includes an oxide.

3. The semiconductor device as claimed in claim 1, wherein no electrical signals are applied to one of the gate electrodes that is disposed at a level directly above or directly below the dummy gate electrode.

4. The semiconductor device as claimed in claim 1, further comprising contact plugs electrically connected to respective ones of the gate electrodes except for the dummy gate electrode.

5. The semiconductor device as claimed in claim 4, further comprising upper wirings electrically connected to the contact plugs and applying electrical signals thereto,
wherein the upper wirings are not electrically connected to one of the gate electrodes that is disposed at a level directly above or directly below the dummy gate electrode.

6. The semiconductor device as claimed in claim 1, wherein each of the gate electrodes extends in a second direction parallel to the upper surface of the substrate, and end portions in the second direction of the gate electrodes are disposed to form steps arranged in the second direction.

7. The semiconductor device as claimed in claim 6, wherein the etch stop layer extends in the second direction, and an end portion of the etch stop layer in the second direction is aligned with an end portion in the second direction of the dummy gate electrode in a plan view.

8. The semiconductor device as claimed in claim 1, wherein a width of the first portion of the channel except for an upper portion of the channel increases by a first increase rate from a bottom toward a top of the channel, and a width of the upper portion of the channel increases by a second increase rate greater than the first increase rate from a bottom toward a top of the channel.

9. The semiconductor device as claimed in claim 1, wherein the first portion of the channel has a cup-like shape, and the second portion of the channel has a cylindrical shape connected to the first portion.

10. The semiconductor device as claimed in claim 9, further comprising:
a charge storage structure covering an outer sidewall of the channel;
a filling pattern contacting an inner sidewall of the channel and having a pillar shape; and
a pad on upper surfaces of the channel and the filling pattern, the pad contacting an inner sidewall of the charge storage structure.

11. A semiconductor device, comprising:
a gate electrode structure on a substrate, the gate electrode structure including gate electrodes spaced apart from each other in a first direction perpendicular to an upper surface of the substrate and stacked in a staircase shape;
a memory channel structure extending through the gate electrode structure, the memory channel structure including:
a channel including:
a first portion extending in the first direction on the substrate; and
a second portion extending in the first direction on and contacting the first portion, a lower surface of the second portion having a width less than a width of an upper surface of the first portion;
a charge storage structure on an outer sidewall of the channel;
a filling pattern contacting an inner sidewall of the channel and having a pillar shape; and
a pad on upper surfaces of the channel and the filling pattern, the pad contacting an inner sidewall of the charge storage structure;
an etch stop layer on a sidewall of the gate electrode structure and contacting a dummy gate electrode of the gate electrodes, the dummy gate electrode including an insulating material, and the etch stop layer overlapping an upper portion of the first portion of the channel in a horizontal direction parallel to the upper surface of the substrate;
contact plugs electrically connected to respective ones of the gate electrodes except for the dummy gate electrode; and
first upper wirings electrically connected to the contact plugs and applying electrical signals thereto.

12. The semiconductor device as claimed in claim 11, wherein the dummy gate electrode is one of a plurality of dummy gate electrodes at a plurality of levels, respectively.

13. The semiconductor device as claimed in claim 11, wherein the dummy gate electrode includes a nitride, and the etch stop layer includes an oxide.

14. The semiconductor device as claimed in claim 11, wherein the first upper wirings are not electrically connected to one of the gate electrodes that is disposed at a level directly above or directly below the dummy gate electrode.

15. The semiconductor device as claimed in claim 11, wherein each of the gate electrodes extends in a second direction parallel to the upper surface of the substrate, and end portions in the second direction of the gate electrodes are disposed to form steps arranged in the second direction.

16. The semiconductor device as claimed in claim 15, wherein the etch stop layer extends in the second direction, and an end portion of the etch stop layer in the second direction is aligned with an end portion in the second direction of the dummy gate electrode in a plan view.

17. The semiconductor device as claimed in claim 11, wherein the first portion of the channel has a cup-like shape, and the second portion of the channel has a cylindrical shape connected to the first portion.

18. The semiconductor device as claimed in claim 11, further comprising:
lower wirings under the substrate;
a through via extending through the substrate in the first direction, the through via being electrically connected to one of the lower wirings; and
a second upper wiring on the through via, the second upper wiring being electrically connected thereto.

19. An electronic system, comprising:
a controller; and
a semiconductor device electrically connected to the controller through an input/output pad, the semiconductor device including:
peripheral circuit wirings electrically connected to the input/output pad; and
a memory cell structure electrically connected to the peripheral circuit wirings, the memory cell structure including:
a gate electrode structure on a substrate, the gate electrode structure including gate electrodes spaced apart from each other in a first direction perpendicular to an upper surface of the substrate and stacked in a staircase shape;
a channel extending through the gate electrode structure, the channel including:
a first portion extending in the first direction on the substrate; and
a second portion extending in the first direction on and contacting the first portion, a lower surface of the second portion having a width less than a width of an upper surface of the first portion;

a charge storage structure on an outer sidewall of the channel; and an etch stop layer on a sidewall of the gate electrode structure and contacting a dummy gate electrode of the gate electrodes, the dummy gate electrode including an insulating material, and the etch stop layer overlapping an upper portion of the first portion of the channel in a horizontal direction parallel to the upper surface of the substrate.

20. The electronic system as claimed in claim 19, further comprising:

a filling pattern contacting an inner sidewall of the channel and having a pillar shape;

a pad on upper surfaces of the channel and the filling pattern and contacting an inner sidewall of the charge storage structure;

contact plugs electrically connected to respective ones of the gate electrodes among the gate electrodes except for the dummy gate electrode; and upper wirings electrically connected to the contact plugs and applying electrical signals thereto.

* * * * *